US 11,100,417 B2

(12) United States Patent
Pednault et al.

(10) Patent No.: US 11,100,417 B2
(45) Date of Patent: Aug. 24, 2021

(54) SIMULATING QUANTUM CIRCUITS ON A COMPUTER USING HIERARCHICAL STORAGE

(71) Applicant: International Business Machines Corporation, Armonk, NY (US)

(72) Inventors: Edwin Peter Dawson Pednault, Cortlandt Manor, NY (US); Giacomo Nannicini, New York, NY (US); John A. Gunnels, Somers, NY (US); Lior Horesh, North Salem, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 629 days.

(21) Appl. No.: 15/974,326

(22) Filed: May 8, 2018

(65) Prior Publication Data

US 2019/0347575 A1 Nov. 14, 2019

(51) Int. Cl.
  *G06F 30/30* (2020.01)
  *G06F 30/33* (2020.01)
  *G06N 10/00* (2019.01)

(52) U.S. Cl.
  CPC .............. *G06N 10/00* (2019.01); *G06F 30/30* (2020.01); *G06F 30/33* (2020.01)

(58) Field of Classification Search
  CPC ........ G06F 30/33; G06F 30/30; G06T 11/206; G06N 10/00; G06N 3/084
  See application file for complete search history.

(56) References Cited

U.S. PATENT DOCUMENTS

| 7,353,148 B1 | 4/2008 | Meyers et al. |
| 7,657,071 B2 * | 2/2010 | Bartesaghi ....... G01R 33/56341 382/128 |
| 9,064,067 B2 | 6/2015 | Wecker |

(Continued)

FOREIGN PATENT DOCUMENTS

CN            104750945 A       7/2015

OTHER PUBLICATIONS

International Search Report and Written Opinion received for PCT Application Serial No. PCT/EP2019/059633 dated Jul. 19, 2019, 15 pages.

(Continued)

*Primary Examiner* — Thai Q Phan
(74) *Attorney, Agent, or Firm* — Amin, Turocy & Watson, LLP

(57) ABSTRACT

Described herein is a simulation of an input quantum circuit, comprising a machine-readable specification of a quantum circuit. Aspects include partitioning the input quantum circuit into a group of sub-circuits based on at least two groups of qubits identified for tensor slicing, wherein the resulting sub-circuits have associated sets of qubits to be used for tensor slicing. The simulating can occur in stages, one stage per sub-circuit. A set of qubits associated with a sub-circuit can be used to partition the simulated quantum state tensor for the input quantum state circuit into quantum state tensor slices, and the quantum gates in that sub-circuit can used to update the quantum state tensor slices into updated quantum state tensor slices. The updated quantum state tensor slices are stored to secondary storage as micro slices.

25 Claims, 16 Drawing Sheets

(56) References Cited

U.S. PATENT DOCUMENTS

| | | | |
|---|---|---|---|
| 9,477,796 | B2 | 10/2016 | Garcia-Ramirez et al. |
| 9,710,586 | B2 | 7/2017 | Muller et al. |
| 2015/0339417 | A1* | 11/2015 | Garcia-Ramirez ..... G06F 17/16 703/2 |
| 2016/0328253 | A1 | 11/2016 | Majmundar |
| 2017/0161632 | A1* | 6/2017 | Freedman ............... G06F 17/18 |
| 2017/0286858 | A1 | 10/2017 | La Cour et al. |
| 2017/0357907 | A1* | 12/2017 | Krovi ..................... G06N 20/00 |
| 2018/0260730 | A1* | 9/2018 | Reagor ............... H03K 19/195 |
| 2018/0301223 | A1* | 10/2018 | Alter ...................... G16B 20/00 |
| 2019/0080232 | A1* | 3/2019 | Choi ..................... G06N 3/084 |
| 2019/0095561 | A1* | 3/2019 | Pednault ................ G06F 30/33 |
| 2019/0286774 | A1* | 9/2019 | Nannicini ............. G06T 11/206 |

OTHER PUBLICATIONS

Avila et al., "Optimizing D-GM quantum computing by exploring parallel and distributed quantum simulations under GPUs arquitecture", IEEE Congress on Evolutionary Computation (CEC), Jul. 1, 2016, pp. 5146-5153.

Pednault et al., "Breaking the 49-Qubit Barrier in the Simulation of Quantum Circuits", URL: https://arxiv.org/abs/1710.05867v1, Oct. 16, 2017, pp. 1-24.

Chen et al., "64-qubit quantum circuit simulation", Science Bulletin, vol. 63, No. 15, 2018, 964-971.

Häner, et al., "High Performance Emulation of Quantum Circuits," arXiv:1604.06460v1 [quant-ph] Apr. 21, 2016, 9 pages.

Amariutei, et al., "Parallel Quantum Computer Simulation on the GPU," Last Accessed: Apr. 3, 2018, 6 pages.

Avila, et al., "Efficient In-Situ Quantum Computing Simulation of Shor's and Grover's Algorithms," 2017 29th International Symposium on Computer Architecture and High Performance Computing Workshops, 6 pages.

Häner, et al., "0.5 Petabyte Simulation of a 45-Qubit Quantum Circuit," arXiv:1704.01127v2 [quant-ph] Sep. 18, 2017, 10 pages.

Pednault, et al., "Simulating Quantum Circuits," U.S. Appl. No. 15/713,323, filed Sep. 22, 2017, 74 pages.

Boixo, et al., "Characterizing quantum supremacy in near-term devices," Nature Physics (2018), doi:10.1038/s41567-018-0124-x, 9 pages.

Boixo, et al, "Characterizing quantum supremacy in near-term devices," Supplementary Information, Nature Physics (2018), doi:10.1038/s41567-018-0124-x, 17 pages.

Li, et al., "Quantum Supremacy Circuit Simulation on Sunway TaihuLight," arXiv:1804.04797v2 [quant-ph] Apr. 16, 2018, 10 pages.

Boixo, et al., "Characterizing quantum supremacy in near-term devices," Articles, Nature Physics (2018), doi:10.1038/s41567-018-0124-x, 6 pages.

Chen, et al., "Classical Simulation of Intermediate-Size Quantum Circuits," arXiv:1805.01450v1 [quant-ph] May 3, 2018, 12 pages.

Wikipedia, "Remote direct memory access," Last Accessed: May 8, 2018, 2 pages.

* cited by examiner

SIMULATING QUANTUM CIRCUITS ON A COMPUTER USING HIERARCHICAL STORAGE

BACKGROUND

The subject disclosure relates generally to quantum computing, and more particularly to simulating quantum circuits. Quantum information processing (quantum computing) holds the potential for solving certain categories of mathematical problems that are intractable with conventional machine computations. A quantum computer employs quantum bits (qubits) to encode information, where qubits are basic units of quantum information. Quantum circuits are based on quantum-mechanical phenomena, such as quantum bit superposition and entanglement of qubits.

Notwithstanding the potential benefits of quantum computing, quantum circuits are difficult and expensive to build, and suffer from various issues such as scaling and quantum de-coherence. The simulation of quantum circuits using commercially-available conventional (non-quantum) computers has thus been employed, including for quantifying circuit fidelity and assessing correctness, performance and scaling, which are based on the ability to calculate quantum state amplitudes for measured outcomes. However, because the number of amplitudes grows exponentially with the number of qubits, calculating quantum state amplitudes for measured outcomes with existing techniques becomes intractable very quickly, overwhelming the computing resources available on even powerful supercomputers. Indeed, one recent publication, BOIXO, et al., "Characterizing quantum supremacy in near-term devices," ARTICLES, Nature Physics (2018), doi:10.1038/s41567-018-0124-x, stated "that the computation of an output amplitude for circuits with 7×7 qubits and depth of approximately 40 cycles is not currently viable." Thus, quantum circuit simulation has been limited to circuits with relatively small numbers of qubits with low circuit depth (the depth of a circuit is the number of layers that the circuit can be partitioned into in such a way that at any given layer, at most one gate acts on a given qubit).

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later.

According to one or more embodiments, a system can comprise a partitioning component that partitions an input quantum circuit comprising a machine-readable specification of a quantum circuit into sub-circuits based on at least two groups of qubits identified for tensor slicing, wherein the sub-circuits have associated sets of qubits to be used for tensor slicing. A simulating component simulates the input quantum circuit in stages based on the sub-circuits into a simulated quantum state tensor, one stage per sub-circuit, wherein a set of qubits associated with a sub-circuit is used to partition the simulated quantum state tensor for the input quantum circuit into quantum state tensor slices and quantum gates in that sub-circuit are used to update the quantum state tensor slices into updated quantum state tensor slices. A read-write component stores the updated quantum state tensor slices of the simulated quantum state tensor to secondary storage as micro slices.

The read-write component can write the micro slices with a size that spans at least two disk sectors of the secondary storage. The read-write component further can retrieve the updated quantum state tensor slices from the secondary storage, and the simulating component can process another sub-circuit into other sub-circuit tensors and update the other sub-circuit tensors with the updated quantum state tensor slices retrieved from the secondary storage into further updated quantum state tensor slices.

According to one or more embodiments, a computer-implemented method can comprise processing an input quantum circuit comprising a machine-readable specification of a quantum circuit. The processing can comprise partitioning the input quantum circuit into groups of sub-circuits based on at least two groups of qubits identified for tensor slicing, wherein the groups of sub-circuits have associated sets of qubits to be used for tensor slicing. Simulating the input quantum circuit can occur in stages based on the groups of sub-circuits into a simulated quantum state tensor, one stage per sub-circuit, wherein a set of qubits associated with a sub-circuit is used to partition the simulated quantum state tensor for the input quantum circuit into quantum state tensor slices and quantum gates in the sub-circuit are used to update the quantum state tensor slices into updated quantum state tensor slices. The computer-implemented method can comprise storing the updated quantum state tensor slices of the simulated quantum state tensor to secondary storage as micro slices.

According to one or more embodiments, a computer program product for simulating quantum circuits including an input quantum circuit comprising a machine-readable specification of a quantum circuit can be provided. The computer program product can comprise one or more computer readable storage media and program instructions stored on the one or more computer readable storage media. The program instructions can be executable by a processing component to cause the processor to partition the input quantum circuit into groups of sub-circuits based on at least two groups of qubits identified for tensor slicing, wherein the groups of sub-circuits have associated sets of qubits to be used for tensor slicing. Further instructions can simulate the input quantum circuit in stages based on the groups of sub-circuits into a simulated quantum state tensor, one stage per sub-circuit, wherein a set of qubits associated with a sub-circuit is used to partition the simulated quantum state tensor for the input quantum circuit into quantum state tensor slices and quantum gates in the sub-circuit are used to update the quantum state tensor slices into updated quantum state tensor slices, and store the updated quantum state tensor slices of the simulated quantum state tensor for the input quantum state circuit to secondary storage as micro slices.

Further instructions can comprise processing another sub-circuit into other sub-circuit tensors, retrieving the updated quantum state tensor slices from the secondary storage, and updating the other sub-circuit tensors with the updated quantum state tensor slices retrieved from secondary storage into further updated quantum state tensor slices. Storing the updated quantum state tensor slices of the simulated quantum state tensor to secondary storage as micro slices can comprise storing the micro slices in at least two disk sectors of the secondary storage.

According to one or more embodiments, a computer-implemented method, which can be executed by a device operatively coupled to at least two processors, can comprise simulating an input quantum circuit comprising a machine-readable specification of a quantum circuit. The simulating can comprise partitioning the input quantum circuit into meta sub-circuits based on at least two groups of qubits identified for tensor slicing, wherein at least one of the meta sub-circuits exceeds the memory of a single processor. The computer-implemented method can comprise sub-partitioning a meta sub-circuit into a sub-sub-circuit that fits within the memory of a single processor, computing tensors for the sub-sub-circuit, and contracting the tensors into tensor slices by tensor slicing.

The computer-implemented method can further comprise applying gates of another sub-circuit to the tensor slices to obtain updated tensor slices representing quantum state data, and storing the updated tensor slices in secondary storage. The secondary storage can comprise one or more disk devices, and the computer-implemented method can further comprise organizing the quantum state data into micro slices, wherein a size of the micro slice spans at least two disk sectors of the secondary storage.

According to one or more embodiments, a computer program product for simulating quantum circuits including an input quantum circuit comprising a machine-readable specification of a quantum circuit can be provided. The computer program product can comprise one or more computer readable storage media and program instructions stored on the one or more computer readable storage media. The program instructions can be executable by a processing component to cause the processor to partition the input quantum circuit into meta sub-circuits based on at least two groups of qubits identified for tensor slicing, wherein at least one of the meta sub-circuits exceeds the memory of a single processor. The program instructions can sub-partition a meta sub-circuit into a sub-sub-circuit that fits within the memory of a single processor, computing tensors for the sub-sub-circuit, and contract the tensors into tensor slices by tensor slicing.

DETAILED DESCRIPTION

Figure 1:
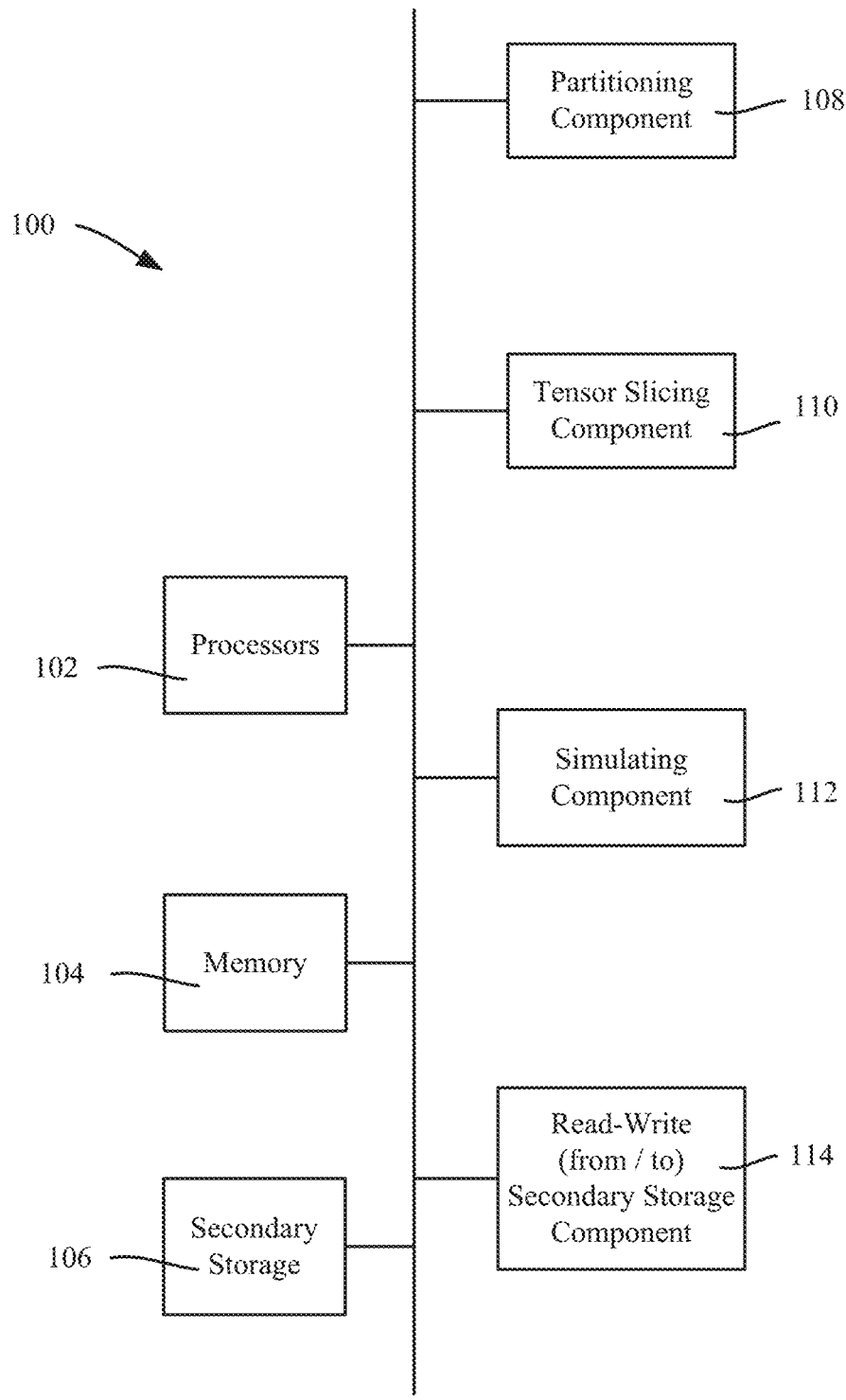
FIG. 1 is an example block diagram of example components that can implement the simulation of quantum circuits based on the technology described herein, according to one or more example embodiments of the present disclosure.

The following detailed description is merely illustrative and is not intended to limit embodiments and/or application or uses of embodiments. Furthermore, there is no intention to be bound by any expressed or implied information presented in the preceding sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Further, it is to be understood that the present disclosure will be described in terms of a given illustrative architecture; however, other architectures, structures and/or operations can be varied within the scope of the present disclosure.

It should be understood that as described herein, an "input quantum circuit" to be simulated on a conventional computer actually refers to a machine☐readable specification of a quantum circuit. It will also be understood that when an element such as a qubit is referred to as being coupled to or connected to another element, it can be directly coupled to or connected to the other element, or indirectly coupled to or connected to the other element by one or more intervening elements that can be present. In contrast, only if and when an element is referred to as being "directly" coupled to or connected to are there are no intervening element(s) present, that is, only if and when an element is referred to as being "directly connected" or "directly coupled" to another element, are there no intervening element(s) present.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

A problem with existing quantum circuit simulation is the large amount of memory needed to simulate the quantum circuits, generally believed impossible or at least not practical above 49 qubits because of memory limitations. More particularly, a 7×7 array of qubits needs $2^{49}$ memory values to represent the possible states of the 49 qubits; when using two eight-byte floating point values to store (complex) qubit state information, eight petabytes of storage are needed; a 56-qubit circuit needs 1 Exabyte of storage.

Described herein is using tensors to represent quantum states in a quantum simulation, along with tensor slicing methods that enable quantum states of circuits to be calculated in slices, instead of having to materialize entire quantum states in main memory. Further described herein is that computations are organized into relatively large tensor slices. Still further, as will be understood, secondary storage is used after calculating quantum states to reasonable circuit depths in-memory, in which the secondary storage usage can be efficient because of the relatively large tensor slices. Moreover, efficient use of secondary storage is described herein based on combining choices in quantum circuit partitioning with choices of data organization, which simultaneously optimize the number of global read/write cycles to secondary storage and the efficiency with which the reads and writes are performed.

Note that "secondary storage" (or hierarchical storage) as described herein comprises least one level of secondary storage. As is understood, the framework described herein can be generalized to address one (secondary) or more levels of storage. Any such storage level can involve its own capacity and access characteristics, which can be factored into the simulation computation and storage allocations. Thus, the technology described herein is not limited to any physical hardware or types of storage devices, but rather can use any device or combination of devices for organizing data into micro slices and that allow data to be transferred in blocks between hardware devices.

As used herein, the terms "simulate" and "execute" (e.g., with respect to a quantum sub-circuit) are essentially synonymous in that (in contrast to many simulations which are mere approximations of something real) the quantum circuit simulation methods disclosed herein yield real, computationally valid, results. As used herein, the phrase "index variable" or the like refers to any type of memory addressing or indexing that results in accessing the desired data and/or memory location.

At least some of the embodiments disclosed herein recognize that quantum circuits may be simulated using less memory than typically assumed. For example, at least some of the embodiments disclosed herein reduce the memory required to represent and simulate quantum circuits comprising X qubits from $2^X$ complex values to a fraction of that quantity. More particularly, at least some of the embodiments disclosed herein recognize that a quantum circuit may be partitioned into sub-circuits by having entangled quantum circuit elements in two or more of the sub-circuits. At least some of the embodiments disclosed herein further recognize that the simulation results of some sub-circuits may be calculated in slices and by so doing the working memory required to simulate the overall quantum circuit, contrary to conventional expectations, can be significantly reduced.

Referring now to the drawings in which like numerals represent the same or similar elements, FIG. 1 shows a general system 100 in which the technology described herein can be implemented. In the example of FIG. 1, processors 102, memory 104 and secondary storage 106 are provided, in the form of a conventional (non-quantum) computer, which may be a super-computer. A partitioning component 108 processes an input quantum circuit (that is, a machine☐readable specification of a quantum circuit for simulation) to partition the input quantum circuit into sub-circuits in the memory 104, represented as tensors (arrays), as described herein.

A tensor slicing component 110 slices the tensors in the memory 104, and a simulating component 112 simulates the input quantum circuit in stages, one stage per sub-circuit, e.g., applying gates, to provide a simulated quantum state tensor for the input quantum state circuit. A read/write (from/to) secondary storage component 114 stores slices of the simulated quantum state tensor for the input quantum state circuit to secondary storage, retrieves slices of the simulated quantum state tensor for the input quantum state circuit from the secondary storage 106, and organizes secondary storage into micro slices according to the combined qubits used for tensor slicing, wherein a slice for a given set of qubits is stored and retrieved as a plurality of micro slices.

Figure 2:
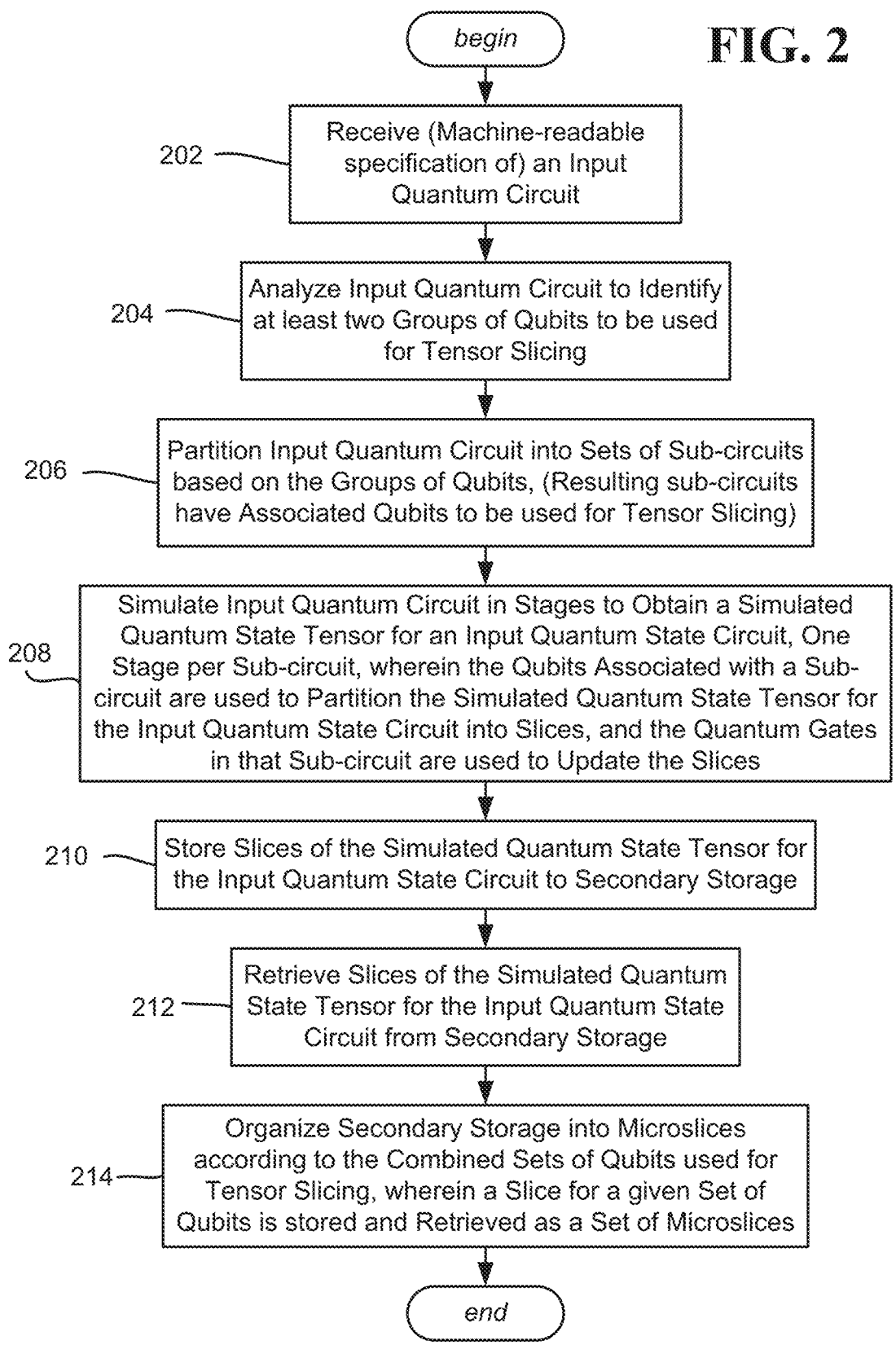
FIG. 2 is a representation of an example flow diagram for simulating quantum circuits based on the technology described herein, according to one or more example embodiments of the present disclosure.

FIG. 2 summarizes example operations of the components of FIG. 1. Repetitive description of like elements employed in other embodiments described herein is omitted for sake of brevity. Operation 202 represents receiving (a machine☐readable specification of) an input quantum circuit. Operation 204 analyzes the input quantum circuit to identify at least two groups of qubits to be used for tensor slicing. Operation 206 partitions the input quantum circuit into a plurality of sub-circuits based on the groups of qubits, wherein any resulting sub-circuit thus has an associated set of qubits to be used for tensor slicing.

Operation 208 represents simulating the input quantum circuit in stages, one stage per sub-circuit. The set of qubits associated with a sub-circuit is used to partition the simulated quantum state tensor for the input quantum state circuit into slices, and the quantum gates in that sub-circuit are applied to update the slices.

Operation 210 represents storing slices of the simulated quantum state tensor for the input quantum state circuit to secondary storage 106 (FIG. 1). Operation 212 represents retrieving slices of the simulated quantum state tensor for the input quantum state circuit from the secondary storage 106. Operation 214 represents organizing the secondary storage into micro slices, according to the combined sets of qubits used for tensor slicing, wherein a slice for a given set of qubits is stored and retrieved as a set of micro slices.

Figure 3:
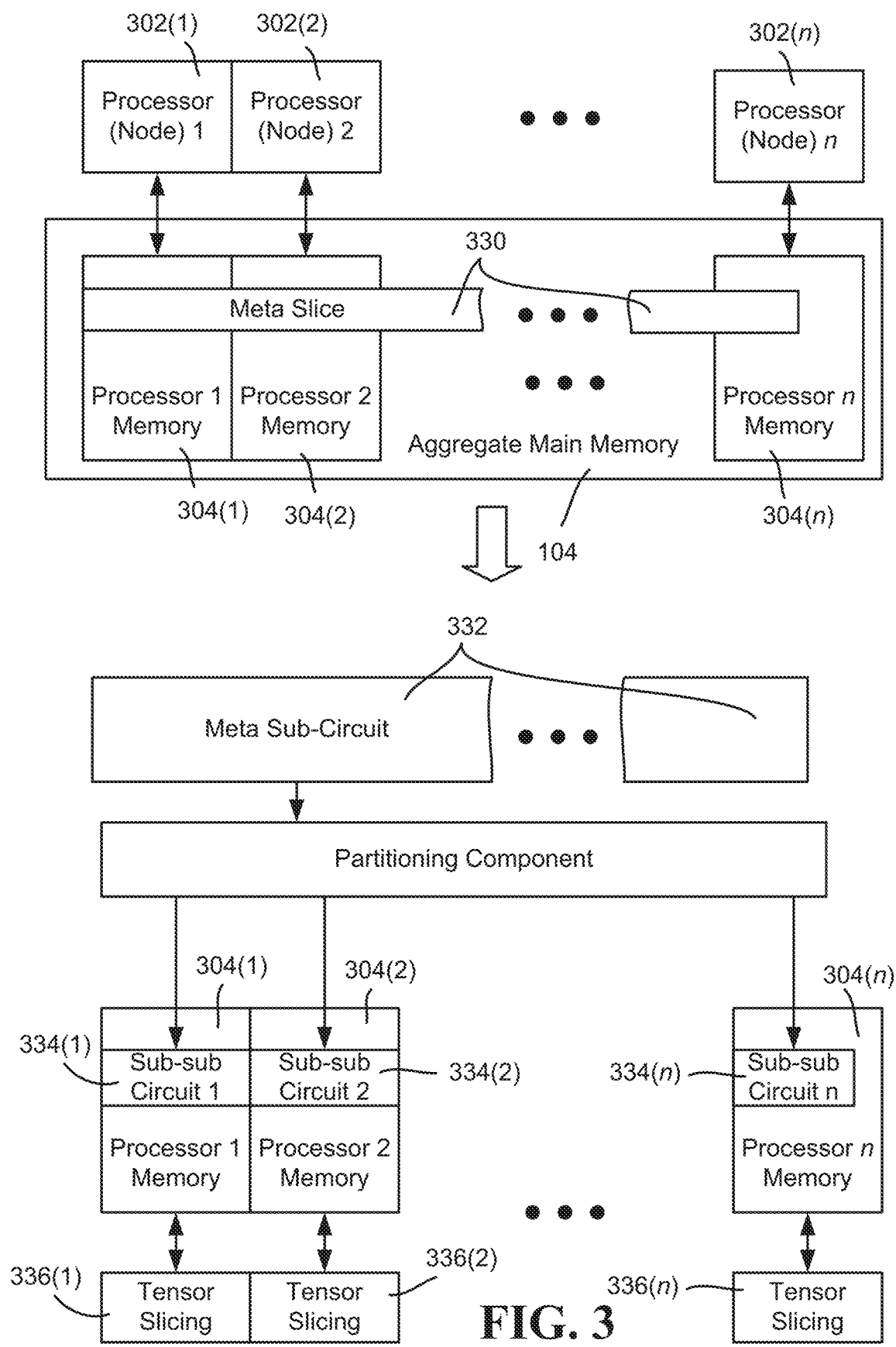
FIG. 3 is a representation of a meta slice comprising a tensor slice of quantum state data that spans the memory of a single processor, and having a corresponding meta sub-circuit partitioned into sub-sub-circuits that fit in a single processor memory for further tensor slicing and processing, according to one or more example embodiments of the present disclosure.

As described herein, to minimize secondary storage costs, computations are organized into fairly large tensor slices, referred to as "meta" slices. In general, the larger the tensor slices, the fewer read/write cycles to secondary storage that are needed. As represented in FIG. 3, a "meta" slice 330 needs to be able to fit into aggregate main memory 104, but does not necessarily need to fit within the memory of a single processor (processing node), e.g., processor 1 memory 304(1) for processor 1 302(1). Corresponding "meta" sub-circuits 332 are then sub-partitioned (e.g., by the partitioning component 108 of FIG. 1) into sub-sub-circuits 334(1)-344(n) so that a known tensor-slicing strategy (instances 334(1)-344(n) of part of the tensor slicing component 110 of FIG. 1) can be applied, using each sub-sub-circuit for inter-processor slicing to minimize communication when applying the gates in each "meta" sub-circuit.

For example, one published approach (Thomas Häner and Damian S Steiger, "0.5 petabyte simulation of a 45-qubit quantum circuit," *arXiv preprint arXiv:* 1704.01127, (2017)), can be applied in the calculations. In this reference, circuits are partitioned so that all gates within a sub-circuit can be applied to update quantum state tensors on a per-slice basis without communicating quantum state information between processing nodes. In this reference, with respect to circuit partitioning and tensor slicing, "global" qubits are used to index across processing nodes that correspond to tensor indices that are being sliced, and "local" qubits correspond to tensor indices that are being used to index into tensor slices stored on each processing node. Zero-communication updates are possible when all non-diagonal gates in a sub-circuit are being applied to "local" qubits only. In effect, circuits are partitioned by selecting different subsets of "local" qubits and analyzing which gates can be applied to yield corresponding sub-circuits. During simulation, communication between processing nodes occurs only when the simulation switches from one sub-circuit to another. During these communication phases, the memory layouts of quantum state tensors are reorganized so that new subsets of indices are being used to "globally" index across processing nodes versus "locally" index within the memories of individual nodes, according to the needs of the next sub-circuit to be simulated.

In contrast, described herein is circuit partitioning in which the resulting tensors are stored in secondary storage and quantum states are updated on a per-sub-circuit basis by loading "meta" slices of the resulting tensors into available aggregate memory, applying the gates of a sub-circuit to these meta slices, and then writing the updated meta slices back into secondary storage. Notwithstanding, the above-described published approach can be leveraged to an extent by further partitioning each sub-circuit into sub-sub-circuit, so that the corresponding sub-slices of a meta slice fit within the memories of the individual processors.

Figure 5:
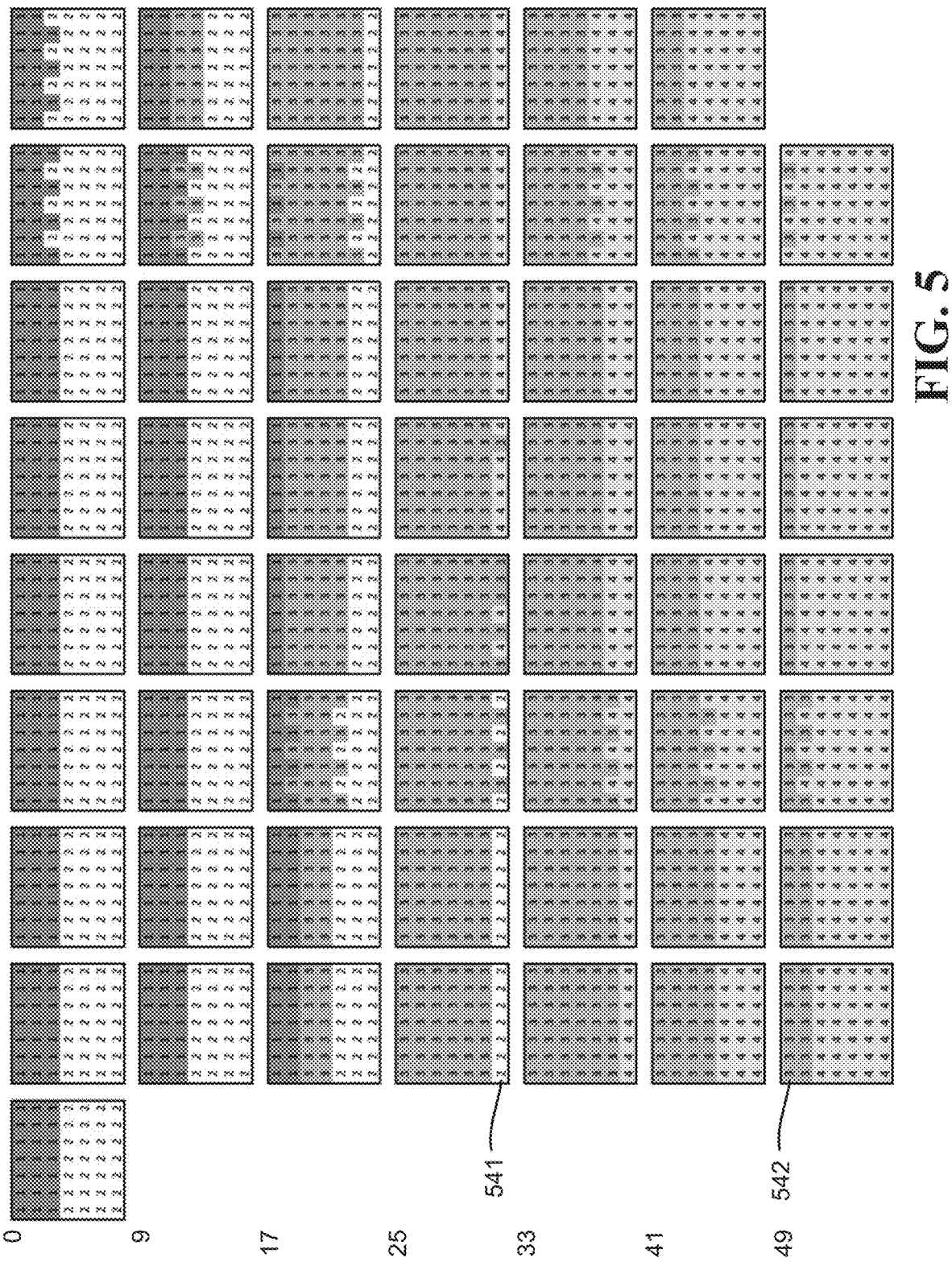
FIG. 5 is a representation of an example forty-nine-qubit quantum circuit of depth fifty-five that is partitioned for quantum circuit simulation, according to one or more example embodiments of the present disclosure.
Figure 6:
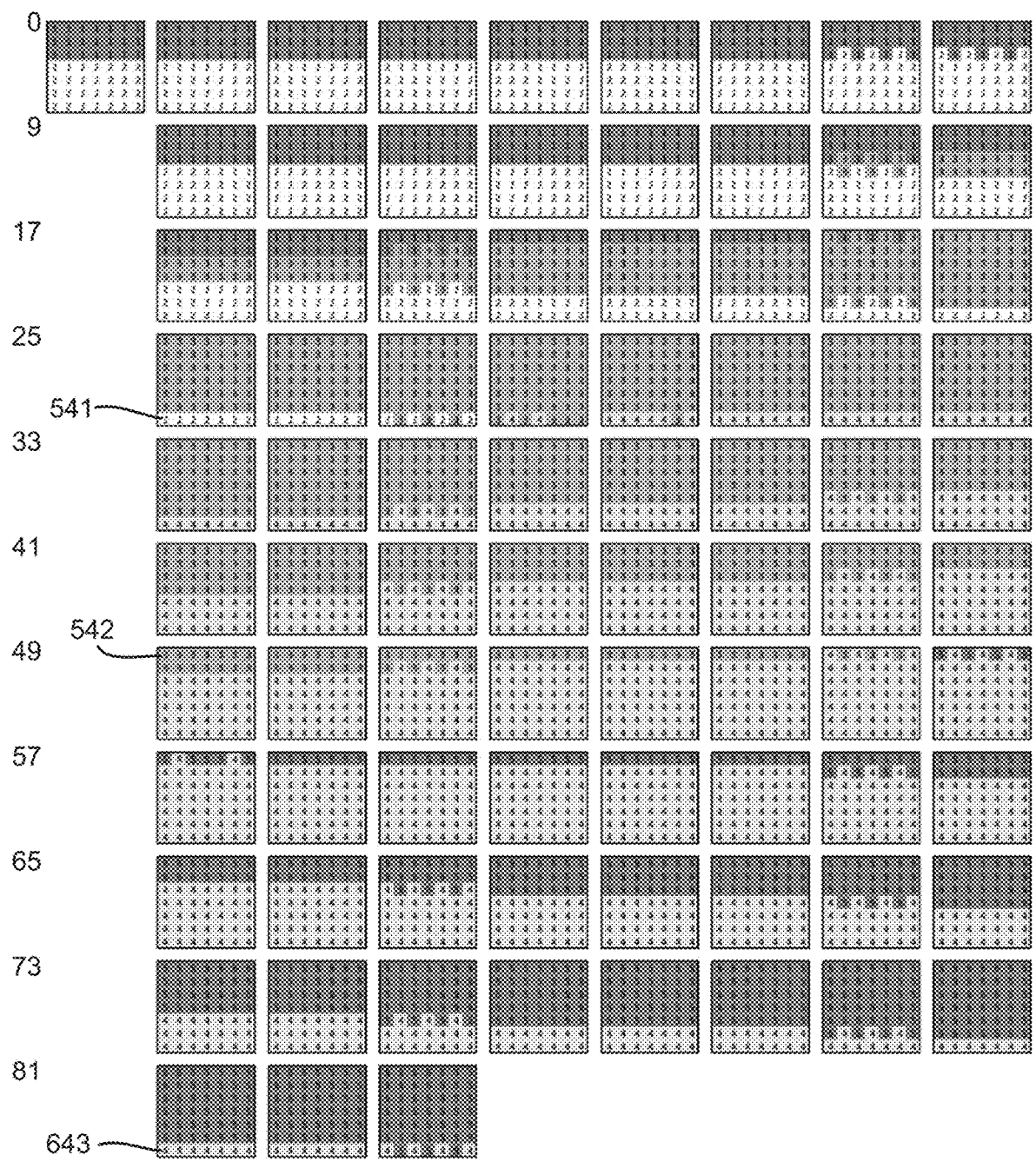
FIG. 6 is a representation of an example forty-nine-qubit quantum circuit of depth eighty-three that is partitioned for quantum circuit simulation, according to one or more example embodiments of the present disclosure.
Figure 7:
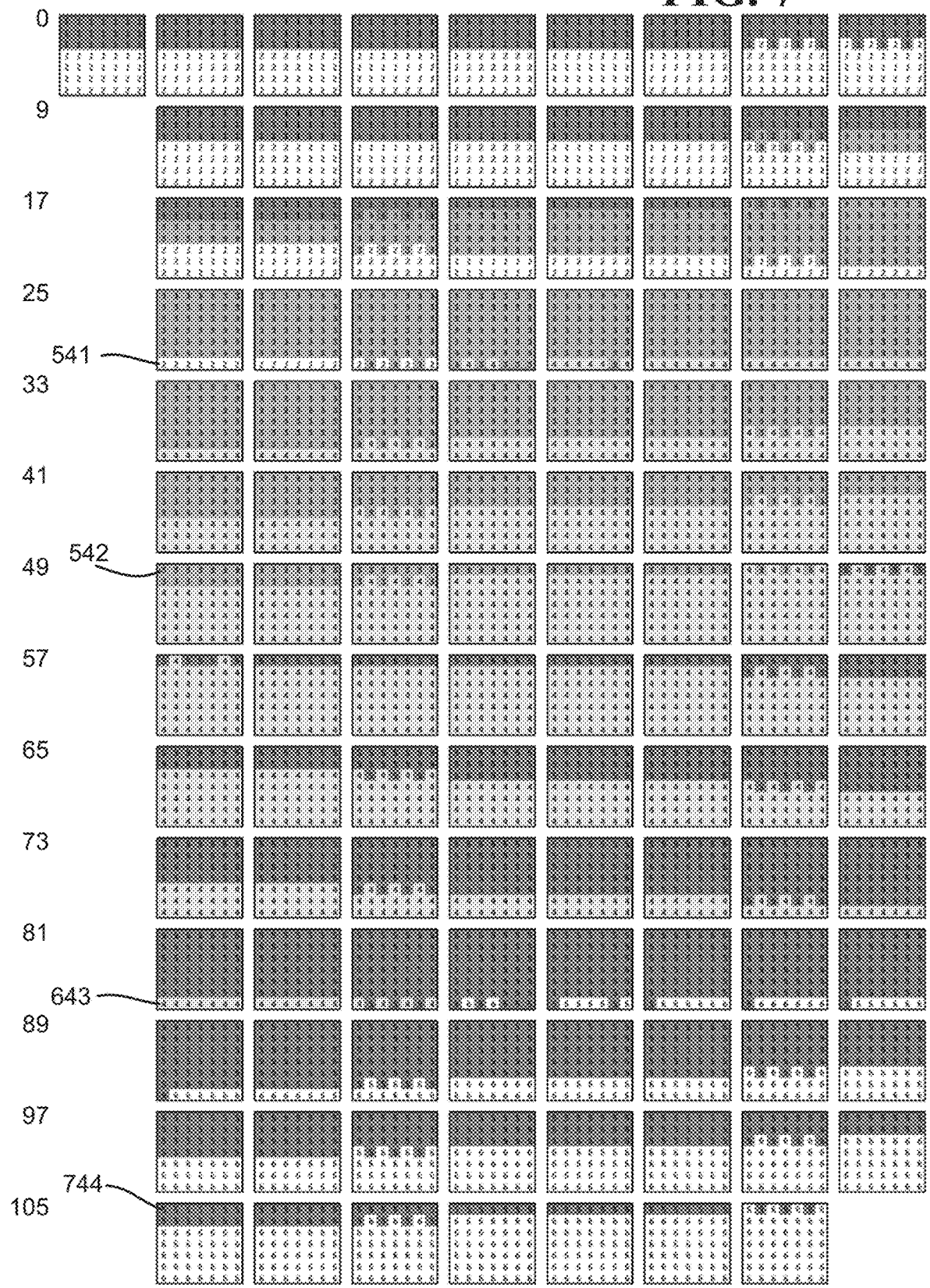
FIG. 7 is a representation of an example 49-qubit quantum circuit of depth 111 that is partitioned for quantum circuit simulation, according to one or more example embodiments of the present disclosure.

A circuit decomposition approach, described herein with reference to FIGS. 8-12B, can be used to bootstrap the overall process by calculating quantum states to reasonable depths completely in-memory before having to write to secondary storage for the first time. By way of example, FIG. 5 represents how partitioning to simulate 49 qubits to circuit depth 27 (e.g., as described in U.S. patent application Ser. No. 15/713,323 filed Sep. 22, 2017) can be extended to circuit depth 55 with one storage read/write cycle. FIG. 6, described below, represents how partitioning to simulate 49 qubits to circuit depth 27 can be extended to circuit depth 83 with two storage read/write cycles, and FIG. 7 represents how partitioning to simulate 49 qubits to circuit depth 27 can be extended to circuit depth 111 with three storage read/write cycles, and so on, up to arbitrary depths.

Figure 4:
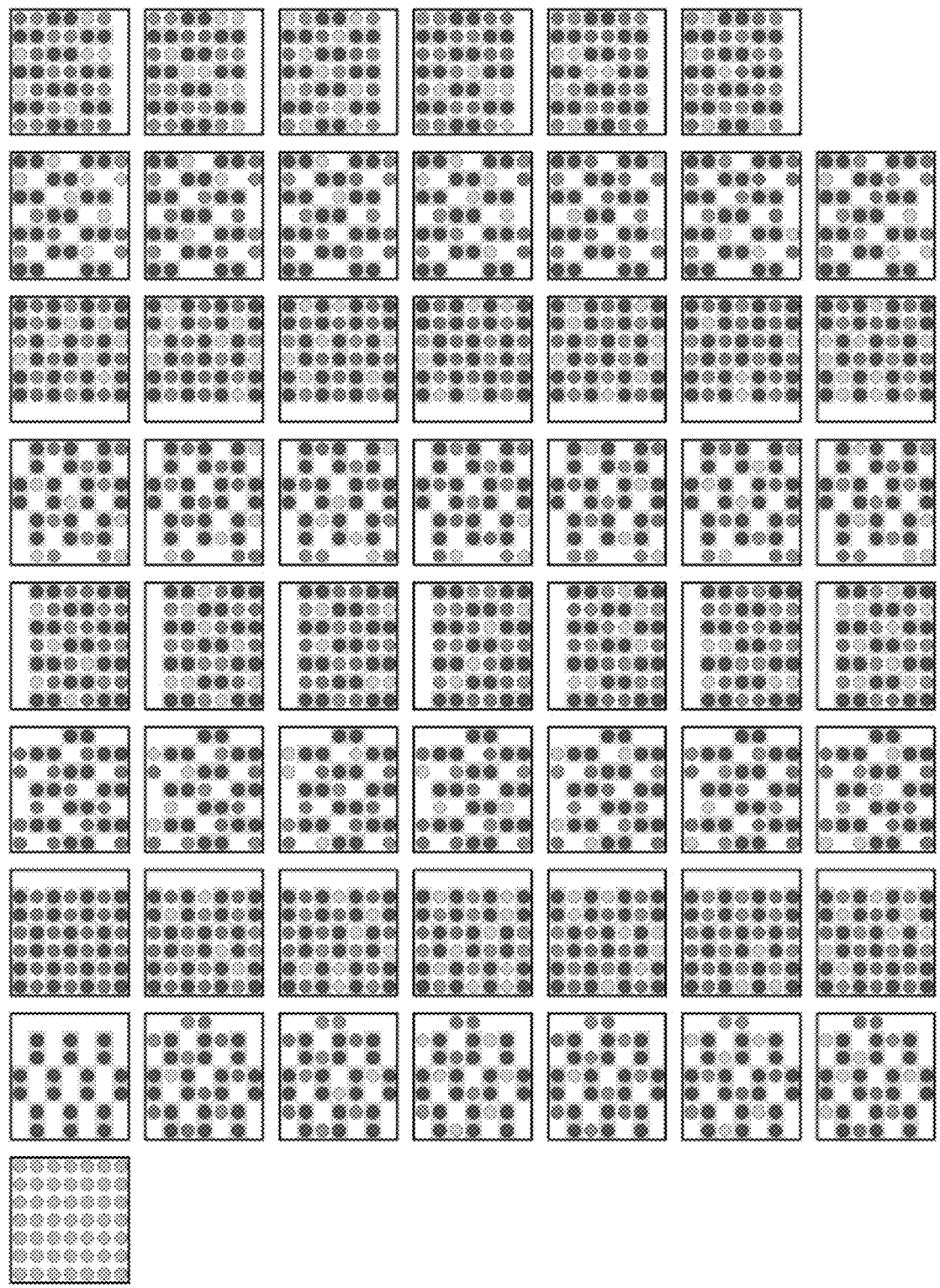
FIG. 4 is a representation of an example forty-nine-qubit quantum circuit of depth fifty-five that generally belongs to a class of randomly generated quantum circuits, according to one or more example embodiments of the present disclosure.

The example of FIG. 4 depicts a 49-qubit, depth 55 quantum circuit that generally belongs to a class of randomly generated quantum circuits. In this example, qubits are arranged into a 7×7 array. A given 7×7 square represents a slice in time and gates applied to the qubits, e.g., gates applied at each level (the levels are shown on the left border, e.g., 0, 9, 17 . . . 49). Level 0 is an initialization level. The pairs of black dots, with each pair surrounded by a gray background, represent controlled-Z (CZ) gates. The other gray-colored dots with white backgrounds represent various single-qubit gates.

FIG. 5 depicts a partitioning and slicing of the circuit shown in FIG. 4 into sub-circuits that enables the quantum circuit to be simulated on currently available computing systems. As will be understood, multiple levels of granularity (e.g., tensor meta slices to micro slices) allow simulation to arbitrary circuit depths as described herein.

In the partitioning scheme of FIG. 5, a given square represents a slice in time of an array of 7×7 qubits and gates applied to the qubits, e.g., gates applied at each level (the levels are shown on the left border, e.g., 0, 9, 17 . . . 49). Level 0 is an initialization level.

In this example, qubits (corresponding to gates) of the quantum circuit are labeled by the numbers 1-4 in FIG. 5. The qubits identified with the number "1" (above a dark gray background) represent gates that belong to one sub-circuit, the qubits identified with the number "2" (with a very light grey background) represent gates that belong to another sub-circuit, the qubits identified with the number "3" (with a medium-to-dark grey background) represent gates that belong to a third sub-circuit, and the qubits identified with the number "4" (with a light-to-medium grey background) represent gates that belong to a fourth sub-circuit. Sub-circuits (e.g., identified via a 1 and 2) can be entangled, where the bridging gates are controlled Z (CZ) gates (in which one of the qubits determines whether a Pauli-Z operation is applied to the other qubit.). These CZ gates can be assigned to either sub-circuit without affecting the ability to simulate the circuit, e.g., and can be arbitrarily assigned to the bottom sub-circuit, for example, as depicted in FIG. 5.

The numbering of the qubits (in conjunction with shading) shows one way to partition gates between sub-circuits for tensor contraction and slicing. In general the process first operates to depth 27, and loops over the values of the last seven rows of qubits, applying computations. In the example of FIG. 5, to extend beyond level 27, secondary storage is used. That is, the partitioning is applied to the qubits/gates identified as 3, and then to those identified as 4.

More particularly, in the example of FIG. 5, the tensors for sub-circuits 1 and 2 are computed in a known manner. The two resulting tensors are contracted into 64 TB slices by slicing the bottom row of 7 qubits. The bottom row of qubits, corresponding to qubits labeled 2, is sliced in a first phase, Phase 1 (the last row of the qubits labeled 2 is labeled row 541 for emphasis). The top row of qubits, corresponding to qubits labeled 3, is sliced in a second phase, Phase 2 (the top row of the qubits labeled 3 is labeled row 542 for emphasis).

The gates in sub☐circuit 3 are applied to each slice, except that now the sub☐circuit 3 extends beyond depth 27, all the way to depth 55, and the updated slices are sent to storage. For sub☐circuit 4, 64 TB slices are retrieved from storage, slicing the top 7 qubits, and the updated slices are sent back to storage.

With respect to FIGS. 6 and 7, in the case of sub-circuit 5, the bottom 7 qubits are sliced once again, yielding 64 TB slices retrieved from storage and the updated slices are then sent back to storage. In FIG. 6, (circuit depth 83) the bottom row of qubits are also sliced in a third phase, Phase 3; (the last row is labeled 643). For sub-circuit 6, the top 7 qubits are sliced, retrieving 64 TB slices from storage and the updated slices are either processed or again sent back to storage. In FIG. 7, (circuit depth 111), the bottom row of qubits are sliced in a third phase, Phase 3, and the top row of qubits are sliced in a fourth phase, Phase 4 (the top row is labeled 744).

The technology described herein thus provides for extending the partitioning of a 7×7-qubit, depth 27 random circuit to greater depths by leveraging secondary storage while at the same time minimizing the number of read/write cycles. Using this partitioning scheme, a 7×7-qubit, depth 55 random circuit generated in a known manner can be simulated using only one read-write cycle (FIG. 5), a 7×7-qubit, depth 83 random circuit can be simulated using only two read-write cycles (FIG. 6), and so on to at least depth 111 (FIG. 7).

In the case of depth 55 circuits, tensors for sub-circuits 1 and 2 are first be calculated and the resulting pairs of tensors are contracted, one slice at a time. The slicing proceeds by looping over the possible values for qubits 43-49 and slicing the tensor for sub-circuit 2 on these values prior to performing the contraction with the tensor for sub-circuit 1. For each of the 128 resulting contraction slices, the gates belonging to sub-circuit 3 in FIG. 5 are then applied to the contraction results and the resulting updated slices are transferred to secondary storage. This process of slicing, contracting, applying gates, and sending results to secondary storage is repeated 128 times in this example, once for each of the 128 possible values of qubits 43-49.

To complete the depth 55 simulation, the gates belonging to sub-circuit 4 in FIG. 5 up to depth 55 are applied to the intermediate results that were transferred to secondary storage. These gate applications can likewise be performed in slices, this time slicing on qubits 1-7. To ensure that the retrieval from secondary storage is performed efficiently, data can be organized in secondary storage as $2^{14}$ micro slices indexed by the values of qubits 1-7 and 43-49, wherein each micro slice contains $2^{35}$ complex amplitudes corresponding to qubits 8-42. Thus, in the phase discussed above of applying gates in sub-circuit 3, for each of the 128 values of qubits 43-49 that are being sliced, 128 micro slices are written to secondary storage corresponding to the 128 possible values of qubits 1-7. In the current phase of applying gates in sub-circuit 4, for each of the 128 values of qubits 1-7 that are being sliced, 128 micro slices are read from secondary storage corresponding to the 128 possible values of qubits 43-49. Once these 128 micro slices of amplitudes are loaded into memory, the gates in sub-circuit 4 can then be applied. Likewise, once these gates are applied, each updated slice can then be written back to storage; alternatively, the final amplitudes can be processed in-memory on a per-slice basis. The read/write (from/to) secondary storage component 114 depicted in FIG. 1 can be implemented to optimize the reading and writing of micro slices by taking into account the physical distribution of secondary storage elements within the computer cluster being employed and the characteristics of the communication network of that cluster, and by exploiting opportunities for parallelism in the reading and writing of micro slices and in the communication of micro slices between processing nodes and storage elements. For example, each micro slice might be stored in distributed fashion across a plurality of physical disk drives to benefit from parallelism, with data striped across sequential sectors on each disk to optimize data transfer rates.

To continue the simulation to depth 83 (FIG. 6), the gates in sub-circuit 4 are applied up to depth 83 and the updated slices are written back to secondary storage. Once this process has been completed for all slices in the simulation of sub-circuit 4, the simulation continues on to sub-circuit 5, shown in FIG. 6, to simulate the remaining gates to depth 83. The process proceeds in the same manner as for sub-circuit 4, except this time, for each of the 128 values of qubits 43-49 that are now being sliced, 128 micro slices are loaded from secondary storage corresponding to the 128 possible values of qubits 1-7.

Similarly, to continue the simulation to depth 111 (FIG. 7), the gates in sub-circuit 5 are applied up to depth 111 and the updated slices are written back to secondary storage. Once this process has been completed for all slices in the simulation of sub-circuit 5, the simulation continues on to sub-circuit 6, shown in FIG. 7, to simulate the remaining gates to depth 111. The process proceeds in the same manner as for sub-circuit 5, except this time, for each of the 128 values of qubits 1-7 that are now being sliced, 128 micro slices logical files are loaded from secondary storage corresponding to the 128 possible values of qubits 43-49.

In accordance with one or more embodiments, in general, minimizing the number of global read/write cycles does not guarantee efficient use of secondary storage. More particularly, data is generally read and written in blocks (disk sectors) when using secondary storage, such that updating a single data item within a block requires reading and rewriting the entire block, whereby the total amount of reading and writing is determined by the number of blocks that have to be updated during global read/write cycles. Choices in circuit partitioning can be combined with choices of data organization so as to simultaneously optimize both the number of global read/write cycles and the efficiency with which the reads and writes are performed.

Quantum state data stored on disk are organized into "micro" slices. The union of all the qubits sliced in a given phase to construct "meta" slices are used for slicing when reading and writing to disk so as to organize the data into "micro" slices. For example, in the example just presented above, qubits 1-7 where sliced in some phases while qubits 43-49 were sliced in other phases, yielding different "meta" slices in each phase. The union of these sliced qubits, that is qubits 1-7, 43-49, are then used to create "micro" slices. Each "meta" slice during a phase of computation thus corresponds to a plurality of "micro" slices. The reading and writing of "meta" slices thus becomes atomic at the "micro" slice level so that redundant reading and writing of "micro" slices will not take place.

Non-redundant disk access is achieved by ensuring the size of each "micro" slice spans multiple disk sectors. The characteristics of the file system can also impact the optimal size for the "micro" slices. The optimization process for choosing which qubits to slice for circuit partitioning during which phases can therefore be considered to yield appropriately sized "micro" slices.

Figure 9:
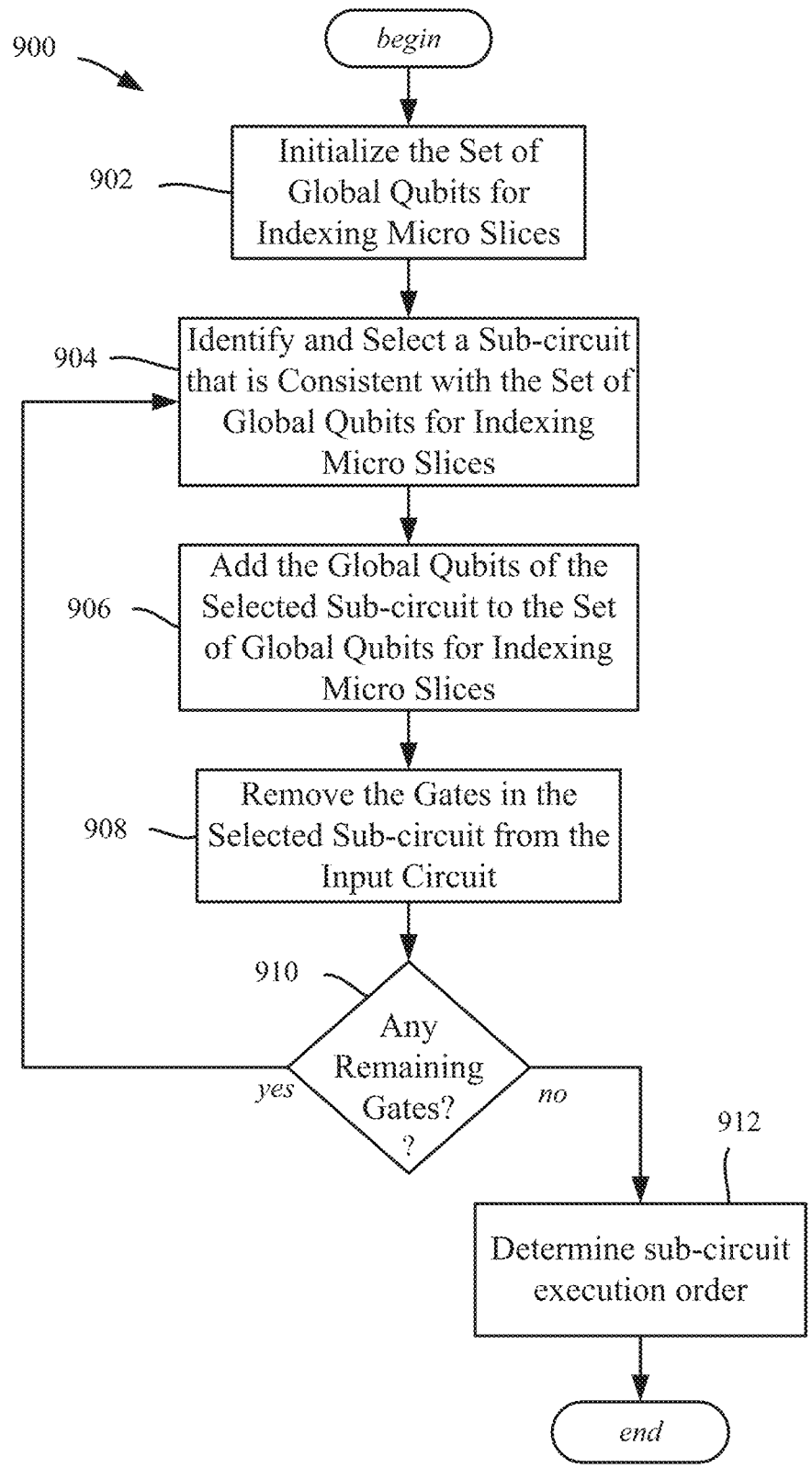
FIG. 9 is a flow diagram depicting one example of a quantum circuit partitioning set of operations, according to one or more example embodiments of the present disclosure.

FIG. 9 is a flow diagram depicting one example of a quantum circuit partitioning set of operations 900 in accordance with at least one embodiment of the technology described herein. As depicted, the quantum circuit partitioning method 900 begins with initializing (operation 902) the set of global qubits to be used for indexing micro slices to be the empty set. Subsequent operations add to this set of global qubits. The number of such qubits determines the size of the micro slices on secondary storage and, thus, a limit is placed on the number of global qubits to be used for indexing micro slices so that the micro slices are sufficiently large to enable efficient secondary storage access.

The quantum circuit partitioning method 900 proceeds with identifying and selecting (operation 904) a sub-circuit that is consistent with the current set of global qubits for indexing micro slices. Consistency in this context means that the global qubits associated with the selected sub-circuit, when added to the current set of global qubits to be used for indexing micro slices, do not cause the resulting set of global qubits to be used for indexing micro slices to exceed the maximum number of such qubits needed to achieve efficient secondary storage access. Operation 904 is followed by adding (operation 906) the global qubits of the selected sub-circuit to the set of global qubits to be used for indexing micro slices and then removing (operation 908) the gates in the selected sub-circuit from the input circuit. The updated input circuit is then examined (operation 910) to determine whether any remaining gates appear in the input circuit and, if so, the quantum circuit partitioning method 900 returns to operation 904 to identify and select the next sub-circuit. If no gates remain, circuit partitioning terminates with determining (operation 912) the execution order of the sub-circuits that were identified and selected.

Figure 10:
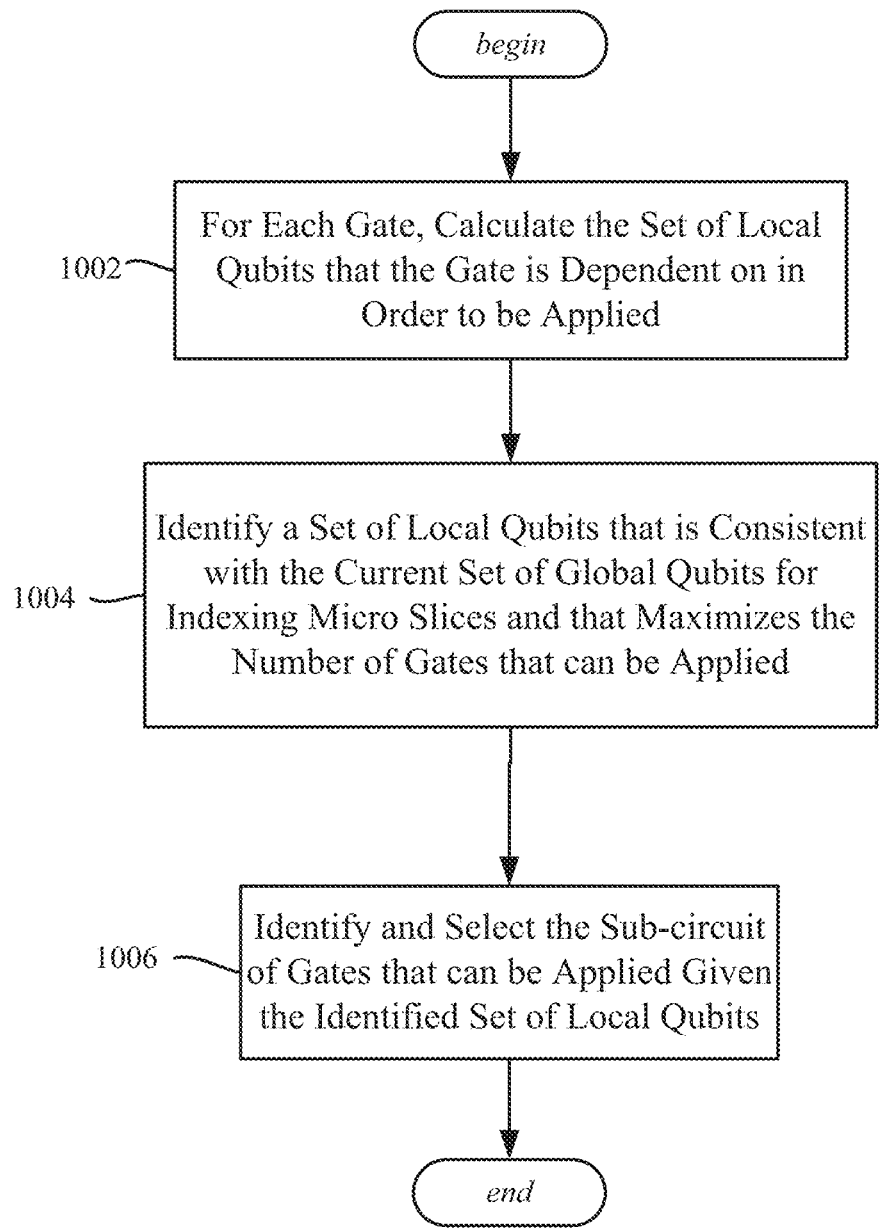
FIG. 10 is a flow diagram depicting additional details of the quantum circuit partitioning operations of FIG. 9, according to one or more example embodiments of the present disclosure.

FIG. 10 depicts at least one embodiment of operation 904. This embodiment includes calculating (operation 1002) the set of local qubits that each gate in the current input circuit is dependent on in order to be applied, identifying (operation 1004) a set of local qubits that is consistent with the current set of global qubits for indexing micro slices and that maximizes the number of gates that can be applied subject to available aggregate memory, and identifying and selecting (operation 1006) the sub-circuit of gates that can be applied given the identified local qubits. In operation 1004, consistency means that adding the global qubits that are not included among the identified local qubits to the current set of global qubits to be used for indexing micro slices does not cause the resulting set of global qubits to be used for indexing micro slices to exceed the maximum number of such qubits needed to achieve efficient secondary storage access.

An embodiment of operation 904 of FIG. 9 can also include a circuit decomposition approach, described herein with reference to FIGS. 8-12B and in U.S. patent application Ser. No. 15/713,323 filed Sep. 22, 2017, in order to bootstrap the overall process by calculating quantum states to reasonable depths completely in-memory before having to write to secondary storage for the first time.

Figure 8:
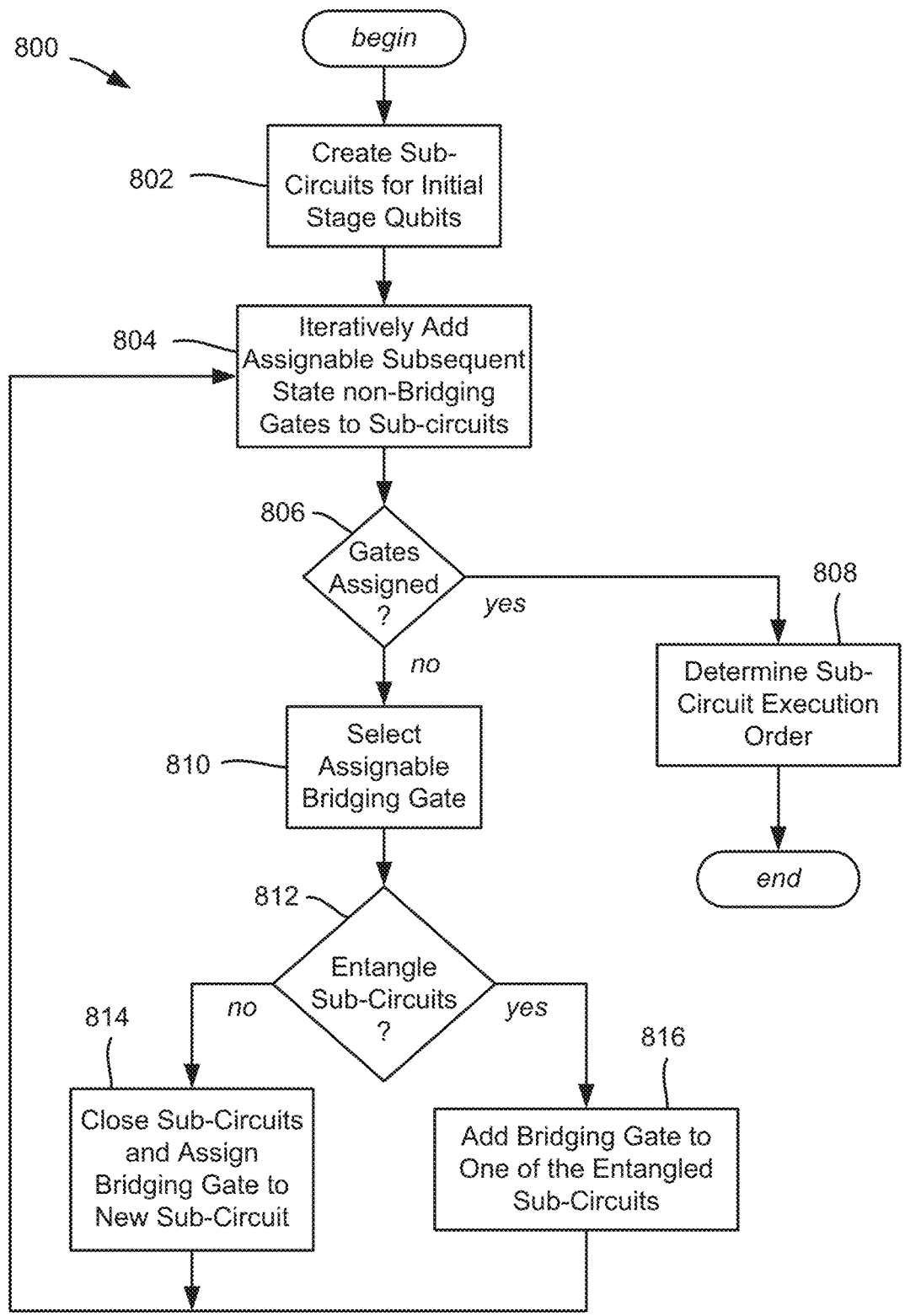
FIG. 8 is a flow diagram depicting example quantum circuit partitioning operations, according to one or more example embodiments of the present disclosure.

FIG. 8 is a flow diagram depicting one example of a quantum circuit partitioning set of operations 800 in accordance with at least one embodiment of the technology described herein. As depicted, the quantum circuit partitioning method 800 includes creating (operation 802) a sub-circuit for each initial stage qubit, adding (operation 804) subsequent stage gates to sub-circuits, and determining (operation 806) whether all relevant gates have been assigned, and if so, determining (operation 808) an execution order.

Until all relevant gates are assigned, operation 810 represents selecting a bridging gate. Operation 812 represents determining whether to entangle the bridged sub-circuits, and if not, closing (operation 814) the bridged sub-circuits, or if so, adding (operation 816) the bridging gate to one of the entangled sub-circuits. The quantum circuit operations 800 enables partitioning of a quantum circuit in a manner that can reduce or minimize the resources needed to simulate the quantum circuit using a conventional computer and associated storage.

Creating (operation 802) the sub-circuit for each initial stage qubit can include determining the number of qubits (at least initially) required by a quantum circuit and initializing a data structure for defining a sub-circuit for each of the qubits required by the quantum circuit. Adding (operation 804) subsequent stage gates to sub-circuits can include adding to each sub-circuit unassigned next stage gates that only require input from qubits that are currently assigned to the sub-circuit. This adding operation also can include determining whether all remaining unassigned gates for a qubit assigned to a sub-circuit are diagonal-unitary gates and, if so, closing that sub-circuit, creating a new sub-circuit with the same assigned qubits as the closed sub-circuit, and marking this new sub-circuit as having been created for the purpose of slicing the assigned qubit(s) for which all remaining unassigned gates are diagonal-unitary gates. Closing a sub-circuit can include marking the sub-circuit as complete in order to prevent the addition of other gates to the sub-circuit.

Determining (operation 806) whether all gates have been assigned can include determining whether an unassigned gate count, or some other indicator, indicates that all gates have been assigned to a sub-circuit. Selecting (operation 810) a bridging gate can include selecting an unassigned next stage gate that requires input from at least one qubit that is currently assigned to a sub-circuit as well as one or more qubits that are not currently assigned to the sub-circuit. In other words, a bridging gate is a gate that requires input from multiple sub-circuits as currently created.

Determining (operation 812) whether to entangle the bridged sub-circuits can include estimating the resource costs of alternative scenarios in which a decision is made to entangle the bridged sub-circuits versus not entangle, comparing the resources costs associated with each decision, and then choosing the lowest-cost alternative. Closing (operation 814) the bridged sub-circuits can include marking the sub-circuits as complete in order to prevent the addition of other gates to the bridged sub-circuits. Assigning (also part of operation 814) the bridging gate to a new sub-circuit can include creating a new sub-circuit, assigning the qubits of the bridged sub-circuits that were closed to this new sub-circuit, and assigning the bridging gate to this new sub-circuit.

Adding (operation 816) the bridging gate to one of the entangled sub-circuits can include adding the bridging gate to a list of gates included in the sub-circuit. This adding operation can also include first replacing the bridging gate with an equivalent combination of gates in which the new bridging gate becomes diagonal-unitary. An example is the replacement of a CNOT gate (FIG. 11A) with a combination of a CZ gate and Hadamard gates as illustrated in FIG. 11B. This can replace the CNOT gate with this equivalent combination of gates, as shown in FIG. 11C. When such a substitution is made, the new bridging gate is assigned to one of the bridged sub-circuits and any single-qubit gates that might have been introduced in this rewrite are assigned to sub-circuits in accordance with the qubits that are assigned to those sub-circuits. For example, in the particular case of replacing a CNOT gate with a CZ gate, the Hadamard gates that are introduced are assigned to the sub-circuit to which the corresponding qubit is assigned in order to conform with the rules for adding subsequent stage gates to sub-circuits described above in connection with operation 804. The CZ gate, on the other hand, can be assigned to either of the sub-circuits being entangled.

Figure 11A:
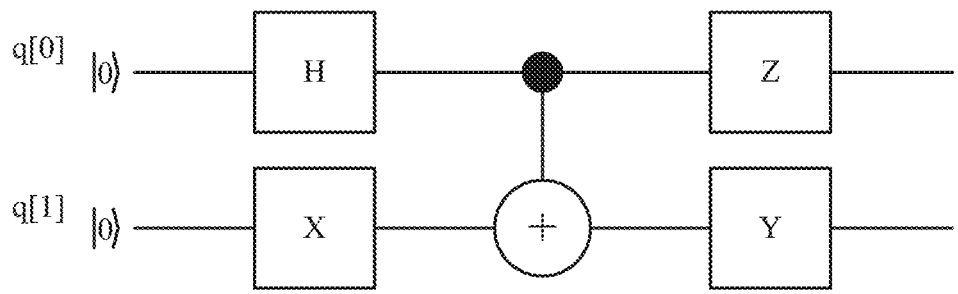
FIGS. 11A-11C are diagrams depicting an example(s) of pre-partitioning optimization of an example of a quantum circuit, according to one or more example embodiments of the present disclosure.
Figure 11B:
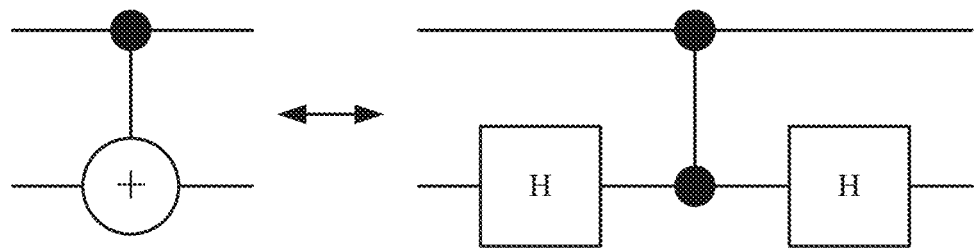
Figure 11C:
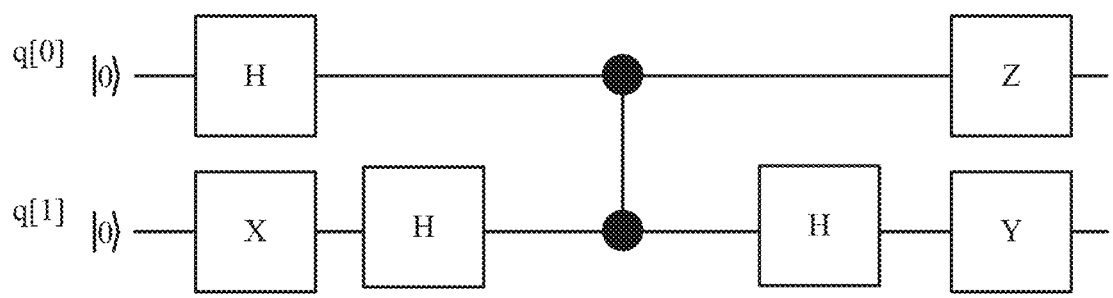

Note that FIGS. 11A-11C are schematic diagrams depicting one example of optimizing one particular example of a quantum circuit. In some embodiments, gate substitutions (also known as circuit rewriting) may be conducted at various points within the technology disclosed herein. For example, a circuit rewrite such as the rewrite shown in FIG. 11B can be performed in conjunction with step 816 (FIG. 8).

More particularly, replacing a bridging CNOT gate with an equivalent configuration of a CZ gate and Hadamard gates can reduce the number of entangled indices that are introduced when the corresponding sub-circuits are entangled, which in turn has the effect of reducing the amount of memory required to simulate the resulting entangled sub-circuits.

FIG. 8 thus shows an example flow diagram that can be used, for example, to find circuit partitionings that minimize the number of floating-point operations for each of the above use cases, as well as other possible use cases of the technology described herein. Examples include depth-first search, breadth-first search, iterative deepening depth-first search, Dijkstra's algorithm, and A* search.

For example, implementing the operations depicted in FIG. 8 as a depth-first recursive optimization process can involve introducing loops at decision points to loop over the possible decision choices, then within these loops recursively invoking the operations depicted in FIG. 8 from those points forward for the possible choices, and at the end of the loops returning the choices that optimize a desired cost measure. These decision points can include operation 810 for selecting an assignable bridging gate, operation 812 for choosing whether to entangle sub-circuits, and operation 816 for assigning a bridging gate to a sub-circuit, and operation 808 for determining a sub-circuit execution order. Some decisions at these points can instead be made by applying rules of thumb while other decisions can be included as part of the depth-first search. Desired resource cost measures to be minimized can include the maximum memory requirements, the total number of floating-point operations to calculate the amplitudes, and/or the total number of floating-point operations to calculate a single amplitude. Conditional tests can also be introduced to abandon choices if desired constraints are violated. Desired constraints can include having the total memory requirements for a simulation remain within a specified limit. They can also include a limit on the total runtime consumed by the depth-first process itself. The depth-first process can be implemented to keep record of the current best set of choices found thus far according to a desired resource cost measure so that if the depth-first process is terminated before a complete search is performed, such as when a runtime limit is imposed, then benefit can still be obtained from having executed the depth-first process.

The depth-first search process effectively generates a tree of possible sequences of decision choices together with circuit partitionings that are thereby induced. Breadth-first search explores this tree one level at a time. The breadth-first search can be implemented as iteratively deepening depth-first search wherein a limit is placed on the number of decisions that are made and branches of the search tree are abandoned once this limit is exceeded. A limit can be placed on the depth of the search, or alternatively on the number of times the entangling choice can be selected at operation 812.

Figure 12A:
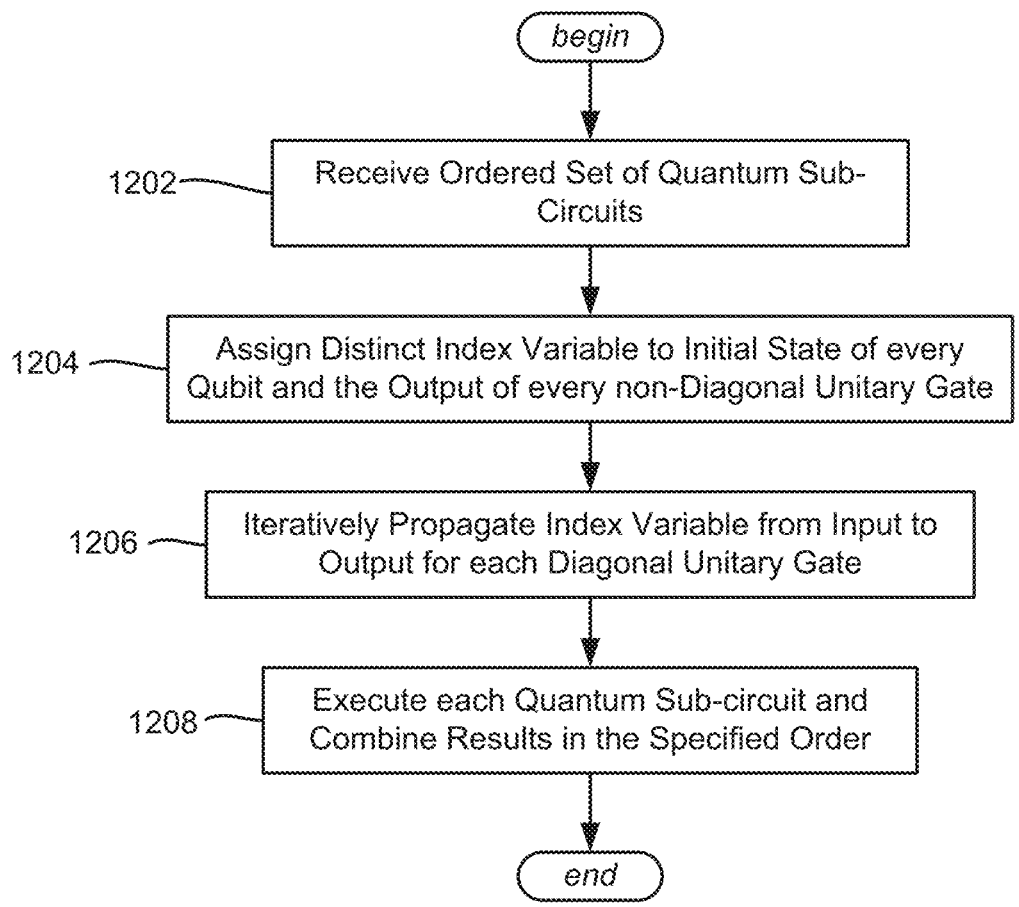
FIG. 12A is a flow diagram depicting an example of quantum circuit execution operations, according to one or more example embodiments of the present disclosure.

FIG. 12A is a flow diagram depicting one example of a quantum circuit execution in accordance with at least one embodiment set forth herein. As depicted, the quantum circuit execution operations include receiving (operation 1202) an ordered set of quantum sub-circuits, assigning (operation 1204) distinct index variables, propagating (operation 1206) the index variables, and executing (operation 1208) each quantum sub-circuit. The exemplified quantum circuit operations can enable execution of a quantum circuit partitioned into sub-circuits.

Receiving (operation 1202) an ordered set of quantum sub-circuits can include receiving an ordered list of pointers to an object or data structure that defines each quantum sub-circuit including the gates contained therein. In one embodiment, the definition for each quantum sub-circuit is essentially a sub-circuit execution plan similar to the execution plan shown in FIG. 8. Assigning (operation 1204) distinct index variables can include assigning a distinct index variable to initial state of every qubit and to the output of every non-diagonal unitary gate.

Propagating (operation 1206) the index variables can include iteratively propagating, from input to output, the index variable for each diagonal unitary gate. Executing (operation 1208) each quantum sub-circuit can include executing each quantum sub-circuit and combining the generated results in the specified order.

Figure 12B:
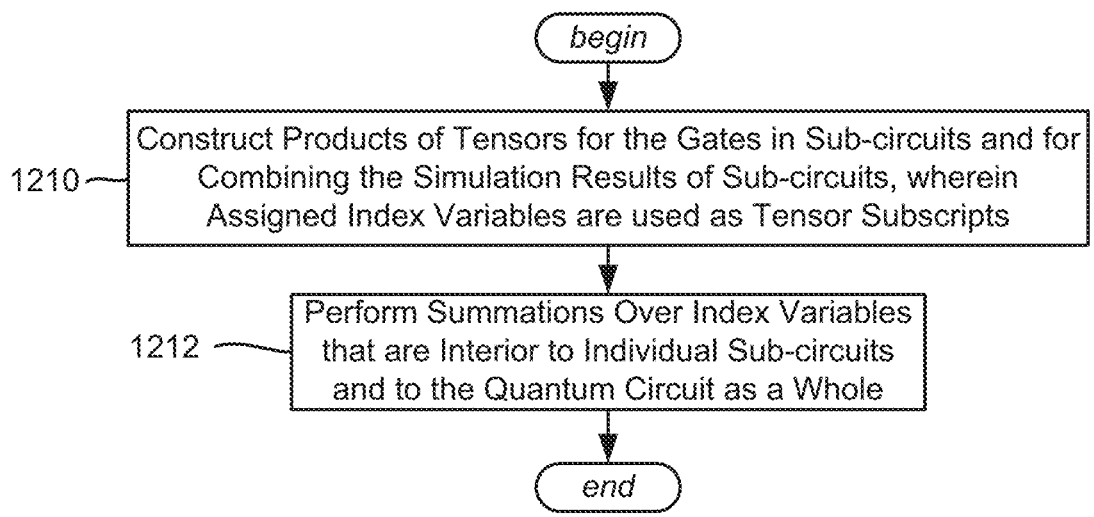
FIG. 12B is a flow diagram depicting additional details of the quantum circuit execution operations of FIG. 12A, according to one or more example embodiments of the present disclosure.

FIG. 12B is a flowchart depicting a possible embodiment of the executing operation 1208 depicted in FIG. 12A. As depicted, an embodiment of executing (operation 1208, FIG. 12A) sub-circuits and combining results can include constructing (operation 1210) products of tensors and performing (operation 1212) summations.

Constructing (operation 1210) products of tensors can include identifying the gates that belong to sub-circuits together with the index variables assigned to those gates at operations 1204 and 1206 of FIG. 12A, assigning these index variables as subscripts to the corresponding tensors for the gates in sub-circuits, and assembling the tensors for sub-circuits into products arranged in input-to-output order. Constructing (operation 1210) products of tensors can also include assembling tensors corresponding to the simulation results of sub-circuits into products of tensors in accordance with execution orderings arrived at through a determining operation (e.g., operation 808 of FIG. 8).

Performing (operation 1212) summations may include calculating products of tensors for sub-circuits in the input-to-output order determined in the constructing operation 1210 described above and performing summations over index variables that are interior to those sub-circuits as they are encountered in the determined input-to-output order. Performing (operation 1212) summations over index variables that are interior to a circuit as a whole may include performing summations over such index variables when calculating products of tensors determined in the constructing operation 1210 described above for combining simulation results of sub-circuits.

In cases where no gates remain to be simulated in a circuit for a qubit, or where all remaining gates for that qubit are diagonal-unitary gates, this combining of simulation results of sub-circuits may be preceded by the introduction of for-loops that loop over the possible values of one or more such qubits. Subsequent tensor products and their summations may then be calculated for slices of affected tensors to reduce the memory requirements of subsequent calculations.

Returning to operation 1208 of FIG. 12A and one of its possible corresponding example embodiments as illustrated in FIG. 12B, in at least one embodiment sub-circuits may be efficiently simulated in input-to-output order starting with the initial sub-circuits created from the initial states of the individual qubits. With such an approach, subsequent sub-circuits are not simulated until the preceding sub-circuits that they depend on for input have been simulated. Simulation results for each sub-circuit can correspond to m-dimensional tensors that can be represented in computer memory as m-dimensional arrays. Other data structures, such as linear arrays, can also be employed to provide equivalent representations.

Thus, described herein is circuit partitioning in which the resulting tensors fit in available aggregate memory in their entirety, or slices of the resulting tensors can be computed using available aggregate memory based on other tensors already computed and stored in aggregate memory. The resulting tensors and/or their slices are generally larger than the memories of individual processing nodes. The existing per-processing node's memory combined with the techniques described herein minimize communication by further partitioning sub-circuits into sub-sub-circuits in such a way that the corresponding sub-slices can fit in the memories of individual nodes.

Further, the techniques can be combined to employ secondary storage when quantum states are too large to fit in aggregate memory. Because secondary storage is typically orders of magnitude slower than main memory, the viability of using secondary storage depends on the extent to which the number of read/write cycles can be minimized. To achieve such minimization, described herein is partitioning the initial portions of a circuit so as to attempt to maximize the number of gates that can be simulated using available aggregate memory, with the resulting quantum state then calculated in slices and written to secondary storage. Known partitioning methods can then be applied to the remaining gates in the circuit with the number of "local" qubits set higher, according to the size of aggregate memory, instead of limited to the memory size available on individual processing nodes. The resulting tensor slices ("meta" slices) are relatively much larger, allowing many more gates to be simulated before additional secondary-storage read/write cycles are needed. As discussed herein, the resulting sub-circuits can then be further partitioned into sub-sub-circuits to minimize internode communication in the overall calculations.

As set forth herein, the partitioning scheme shown in FIGS. 4-7, for a 7×7-qubit, depth 27 random circuit can be extended so that 7×7-qubit, depth 55 circuits (FIG. 5) can be simulated using only one secondary-storage read/write cycle, as well as circuits of depth 83 (FIG. 6), depth 111 (FIG. 7) and so on. The flow diagrams depicted in FIGS. 8-10 can be applied to construct the partitioning scheme shown in FIGS. 5-7. Specifically, flow diagram 800 in FIG. 8 can be used in an embodiment of operation 904 in FIG. 9 on the first iteration of the loop shown in FIG. 9, and then flow diagram 1000 in FIG. 10 can be used as the embodiment of operation 904 in subsequent iterations. In the first iteration of the loop shown in FIG. 9, an embodiment of operation 904 can apply flow diagram 800 in FIG. 8 multiple times with increase depth limits to identify a reasonable depth to which the quantum state can be calculated completely in-memory before having to write to secondary storage for the first time. In this manner, 27 can be identified as such a reasonable depth in the case of FIGS. 4-7. With the depth limit set to 27, sub-circuits 1 and 2 shown in FIGS. 5-7 can be identified by following the "Yes" branch of operation 812 in FIG. 8 when considering the CZ gates that bridge the third and fourth rows at levels 7 and 8 in the circuit, and by following the "No" branch of operation 812 in the case of CZ gates that appear strictly interior to sub-circuits 1 and 2. Doing so produces two pluralities of ordered sub-circuits that correspond to sub-circuits 1 and 2, respectively, shown in FIGS. 5-7. As a by-product of this process, qubits 43-49 can also be identified as being candidates for slicing because all remaining unassigned gates in the circuit up to depth 27 are diagonal-unitary gates. Qubits 43-49 can thus become the identified global qubits to be used for slicing for the purpose of constructing meta slices. Sub-circuit 3 shown in FIGS. 5-7 can be identified by subsequently following the "No" branch of operation 812 in FIG. 8 when considering any one of the CZ gates that bridge the third and fourth rows at levels 15 and 16 in the quantum circuit. The remaining gates in sub-circuit 3 up to depth 27 can then be identified when operation 804 is subsequently applied. To extend the partitioning beyond depth 27, operation 804 can be continued beyond depth 27 with the constraint that qubits 43-49 are global and, hence, only gates that apply to local qubits 1-42 are considered in extending sub-circuit 3 beyond depth 27. Doing so can produce the partitioning that corresponds to sub-circuit 3 as depicted in FIGS. 5-7. With the above process used as the embodiment of operation 904 in FIG. 9 in the first iteration of the loop shown in FIG. 9, sub-circuits 4, 5 and 6 can then be identified by using flow diagram 1000 in FIG. 10 as the embodiment of operation 904 in subsequent iterations. It should be noted that using flow diagram 800 in an embodiment of operation 904 is not a requirement; however, using flow diagram 800 in the manner described above can increase the depth to which quantum circuits can be simulated before having to write to secondary storage for the first time. It should also be noted that known optimization techniques such as depth-first search, breadth-first search, iterative deepening depth-first search, Dijkstra's algorithm, and A* search can be used in conjunction with flow diagram 900 to optimize the choices made in embodiments of operation 904; for example, to minimize total execution time taking into account computational costs, communication costs, and secondary storage access costs.

One published approach (Riling Li, Bujiao Wu, Mingsheng Ying, Xiaoming Sun, and Guangwen Yang, "Quantum Supremacy Circuit Simulation on Sunway TaihuLight," *arXiv preprint arXiv:*1804.04797, (2018)), demonstrates the feasibility of the computation of single amplitudes of universal random circuits with ≈50 qubits and depth >40, which were thought to be out of reach of current technology. By contrast, as described above, universal random circuits of greater than 50 qubits with arbitrary depth can be fully simulated with all amplitudes calculated on a supercomputer using secondary storage. This results in higher execution times due to the relatively high cost of disk read/write operations, but the slowdown is considerably less than twofold for the instances under study. Moreover, recent system advancements, such as NVRAM-based burst buffers, can have a highly beneficial effect on these run times. The larger memory pool available via secondary storage allows extending the boundary of quantum circuit simulations even further. To this end, quantum circuits can have groups of qubits on the boundary of the grid that periodically do not interact with other qubits for several layers of gates. In particular, for universal random circuits on a 7×7 grid, a group of 7 qubits at the boundary has two layers of two-qubit interactions with other rows or columns, followed by six layers without further interactions (only single-qubit gates or two-qubit gates within the group). For this reason, slicing these qubits is very effective; one of the boundary rows or columns is chosen, and the corresponding qubits for six layers is sliced. The circuit applied to the remaining qubits is simulated independently. More particularly, the technique slices qubits at the boundary of the grid (e.g., the bottom row of the grid), simulating the remaining part of the circuit using Schrödinger's method with a state vector as large as memory allows. The simulation is carried out for as many layers of gates as possible without introducing additional entanglement indices. For qubits on the opposite row/column (e.g., the top row of the grid) this allows applying over thirty layers of gates, whereas for qubits closer to the sliced qubits progress stops at a lesser number of layers before without increasing memory occupancy. This produces several slices of the same size, which are stored to disk. To apply further gates, a new sub-circuit is started, slicing qubits in the row/column opposite to those sliced in the previous sub-circuit (e.g., the top row of the grid), and simulating the rest of the circuit with Schrödinger's method. The initial state can be loaded from the slices stored on disk, and the process can be iterated. This yields a "wave" pattern in the sub-circuits, in which a given sub-circuit starts from the top or bottom row of qubits, then extends to the rest of the circuit until it encompasses the row opposite to the starting set of qubits, at which point it shrinks back. One could reduce the memory requirement (but not the disk storage requirement) by slicing additional qubits, e.g., two rows. Even without disk operations, the technology described herein allows the computation of single amplitudes of a depth-46 circuit on a 7×7 qubit grid.

As described herein, the efficiency of using secondary storage depends on the extent to which the number of read/write cycles can be minimized. The data transfer times required to write $2^{49}$ quantum amplitudes to secondary storage and read them back can be on the order of two-to-five hours with transfer rates around 1.0 to 2.2 TB/second. Quantum amplitudes can be stored in single-precision and/or double-precision storage formats; (when amplitudes are stored in single precision, in-memory calculations can still be carried out in double precision to minimize the accumulation of rounding errors). The use of secondary storage is thus practical provided that the number of read/write cycles can be kept to a minimum.

Figure 13:
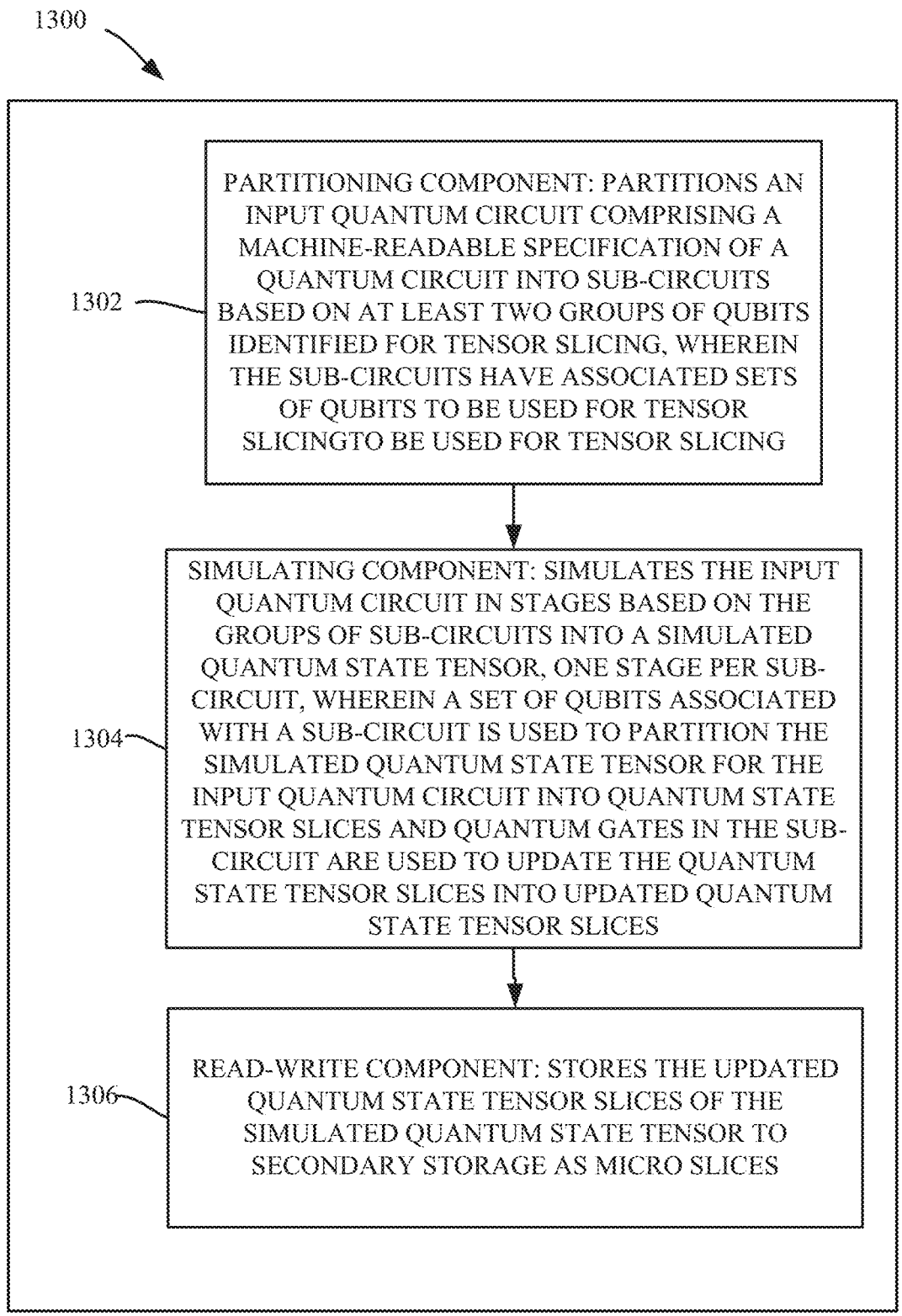
FIG. 13 illustrates a block diagram of an example, non-limiting system for implementing various aspects of the technology described herein.

FIG. 13 represents a system, comprising a partitioning component (block 1302) that a partitioning component that partitions an input quantum circuit comprising a machine-readable specification of a quantum circuit into sub-circuits based on at least two groups of qubits identified for tensor slicing, wherein the groups of sub-circuits have associated sets of qubits to be used for tensor slicing. A simulating component (block 1304) simulates the input quantum circuit in stages based on the groups of sub-circuits into a simulated quantum state tensor, one stage per sub-circuit, wherein a set of qubits associated with a sub-circuit is used to partition the simulated quantum state tensor for the input quantum circuit into quantum state tensor slices and quantum gates in the sub-circuit are used to update the quantum state tensor slices into updated quantum state tensor slices. A read-write component (block 1306) stores the updated quantum state tensor slices of the simulated quantum state tensor to secondary storage as micro slices.

The input quantum circuit can comprise at least forty-nine qubits and have a circuit depth level of at least fifty.

The read-write component can write the micro slices with a size that spans at least two disk sectors of the secondary storage. The read-write component can retrieve the updated quantum state tensor slices from the secondary storage, and the simulating component can process another sub-circuit into other sub-circuit tensors and update the other sub-circuit tensors with the updated quantum state tensor slices retrieved from the secondary storage into further updated quantum state tensor slices. The read-write component can store the further updated quantum state tensor slices in the secondary storage.

The partitioning component can partition the input quantum circuit into qubit partitioning groups corresponding to the sub-circuits, including a first qubit partitioning group, a second qubit partitioning group, a third qubit partitioning group and a fourth qubit partitioning group. The simulating component can apply quantum gates of the third group to the tensor slices of the first and second group to obtain the updated quantum state tensor, and the read-write component can read the updated quantum state tensor slices from the secondary storage into memory. The simulating component can apply quantum gates of the fourth group to the updated quantum state tensor slices to obtain a further updated quantum state tensor.

Figure 14:
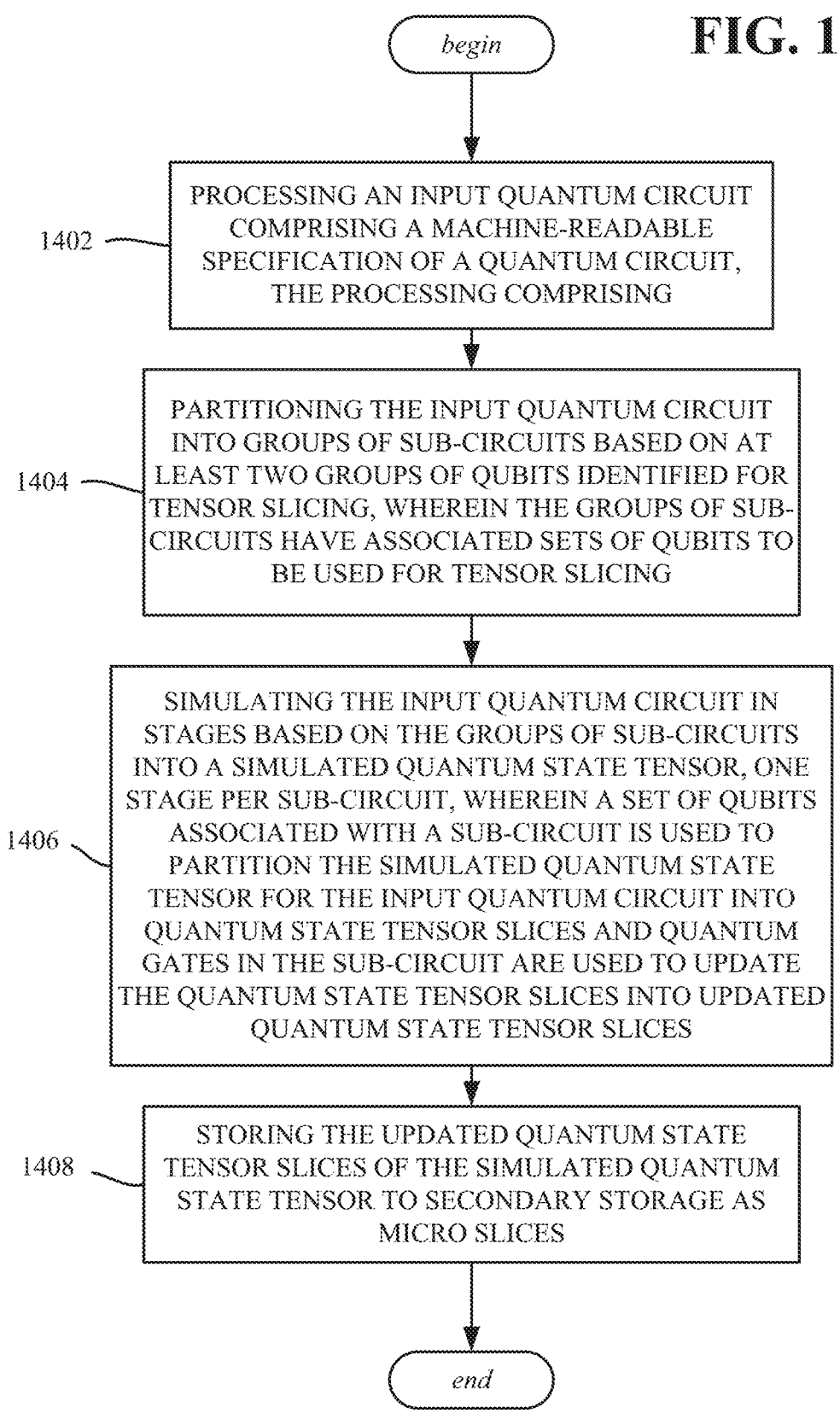
FIG. 14 illustrates a block diagram of an example, non-limiting computer-implemented method for implementing various aspects of the technology described herein.

FIG. 14 represents an example computer-implemented method, in which operation 1402 represents processing an input quantum circuit comprising a machine-readable specification of a quantum circuit. The processing can comprise partitioning, (e.g., operation 1404 performed by the partitioning component 108 of FIG. 1) the input quantum circuit into groups of sub-circuits based on at least two groups of qubits identified for tensor slicing, wherein the groups of sub-circuits have associated sets of qubits to be used for tensor slicing. Operation 1406 represents simulating (e.g., by the simulating component 112 of FIG. 1) the input quantum circuit in stages based on the groups of sub-circuits into a simulated quantum state tensor, one stage per sub-circuit, wherein a set of qubits associated with a sub-circuit is used to partition the simulated quantum state tensor for the input quantum circuit into quantum state tensor slices and quantum gates in the sub-circuit are used to update the quantum state tensor slices into updated quantum state tensor slices. Operation 1408 represents storing (e.g., by the read-write component 114 of FIG. 1) the updated quantum state tensor slices of the simulated quantum state tensor to secondary storage as micro slices.

Storing the updated quantum state tensor slices of the simulated quantum state tensor to secondary storage as micro slices can comprise storing the micro slices in at least two disk sectors of the secondary storage.

Aspects can comprise processing another sub-circuit into other sub-circuit tensors, retrieving the updated quantum state tensor slices from the secondary storage, and updating the other sub-circuit tensors with the updated quantum state tensor slices retrieved from secondary storage into further updated quantum state tensor slices. Aspects can comprise processing storing the further updated quantum state tensor slices in the secondary storage.

Partitioning the input quantum circuit into the groups of sub-circuits can comprise partitioning the input quantum circuit into a first sub-circuit partitioning group, a second sub-circuit partitioning group and a third sub-circuit partitioning group, and storing the updated quantum state tensor slices can comprise applying gates of the third sub-circuit partitioning group to tensor slices corresponding to the first sub-circuit partitioning group and the second sub-circuit partitioning group to obtain the updated quantum state tensor slices. Partitioning the input quantum circuit into the groups of sub-circuits further can comprise partitioning the input quantum circuit into a fourth sub-circuit partitioning group, and retrieving the updated quantum state tensor slices from the secondary storage; updating the other sub-circuit tensors with the updated quantum state tensor slices retrieved from the secondary storage into further updated quantum state tensor slices can comprise applying gates of the fourth sub-circuit partitioning group.

As is understood, the example operations of FIG. 14 can, in general, be implemented in a computer program product for simulating quantum circuits, including an input quantum circuit comprising a machine☐readable specification of a quantum circuit. To this end, the computer program product can comprise one or more computer readable storage media and program instructions stored on the one or more computer readable storage media. The program instructions can, when executed, correspond to at least some of the operations exemplified in FIG. 14.

Figure 15:
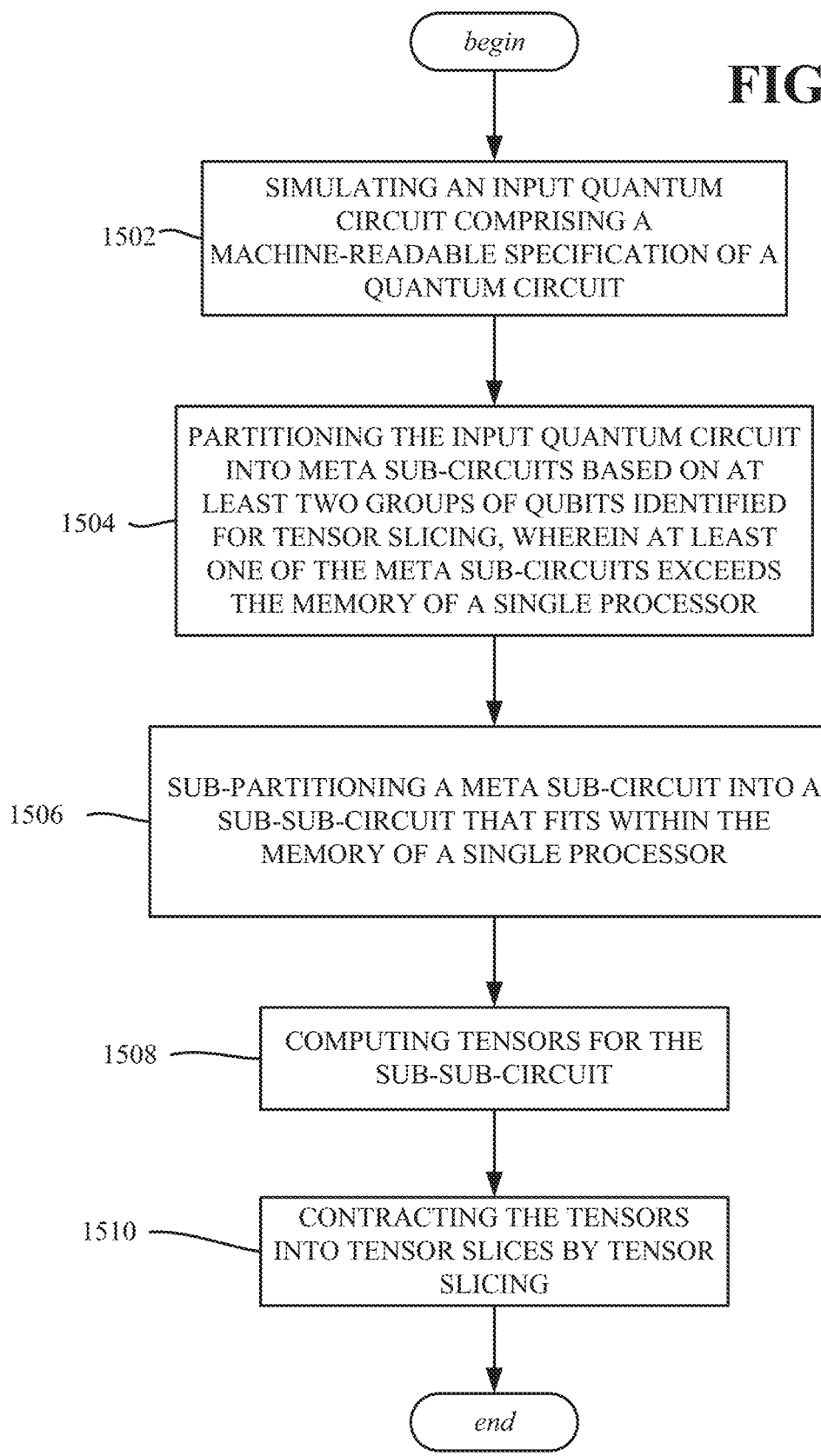
FIG. 15 illustrates a block diagram of another example, non-limiting computer-implemented method for implementing various aspects of the technology described herein.

FIG. 15 represents operations of an example computer-implemented method, which can be executed by a device operatively coupled to at least two processors, comprising operation 1502, which represents simulating an input quantum circuit comprising a machine-readable specification of a quantum circuit. Operation 1504 represents partitioning the input quantum circuit into meta sub-circuits based on at least two groups of qubits identified for tensor slicing, wherein at least one of the meta sub-circuits exceeds the memory of a single processor. Aspects can comprise sub-partitioning a meta sub-circuit into a sub-sub-circuit that fits within the memory of a single processor (operation 1506), computing tensors for the sub-sub-circuit (operation 1508), and contracting the tensors into tensor slices by tensor slicing (operation 1510). Aspects can comprise applying gates of another sub-circuit to the tensor slices to obtain updated tensor slices representing quantum state data, and storing the updated tensor slices in secondary storage. Aspects can comprise retrieving the updated tensor slices from secondary storage, applying gates of a further, other sub-circuit to the updated tensor slices to obtain further updated tensor slices.

The secondary storage can comprise one or more disk devices, and aspects can comprise organizing a meta slice into micro slices, wherein a size of the micro slice spans at least two disk sectors of the secondary storage, and the storing the updated tensor slices in the secondary storage can comprise storing the micro slices. Alternatively, or in addition to disk devices, the secondary storage can comprise NVRAM, Phase-change memory, Flash, and so forth. Moreover, secondary storage can, at least to an extent, refer to "remote" memory. For example, Remote Direct Memory Access allows data to be transferred efficiently without requiring CPU intervention, and thus can be used with micro slices. Note that the operations performed need not be "memory symmetric" in that, for example, a node (e.g., Node 0) can store slices on another node (e.g., Node 158) because Node 158 has more memory, or possesses the same volume of memory, but requires less resources.

As is understood, the example operations of FIG. 15 can, in general, be implemented in a computer program product for simulating quantum circuits, including an input quantum circuit comprising a machine☐readable specification of a quantum circuit. To this end, the computer program product can comprise one or more computer readable storage media and program instructions stored on the one or more computer readable storage media. The program instructions can, when executed, correspond to at least some of the operations exemplified in FIG. 15.

Figure 16:
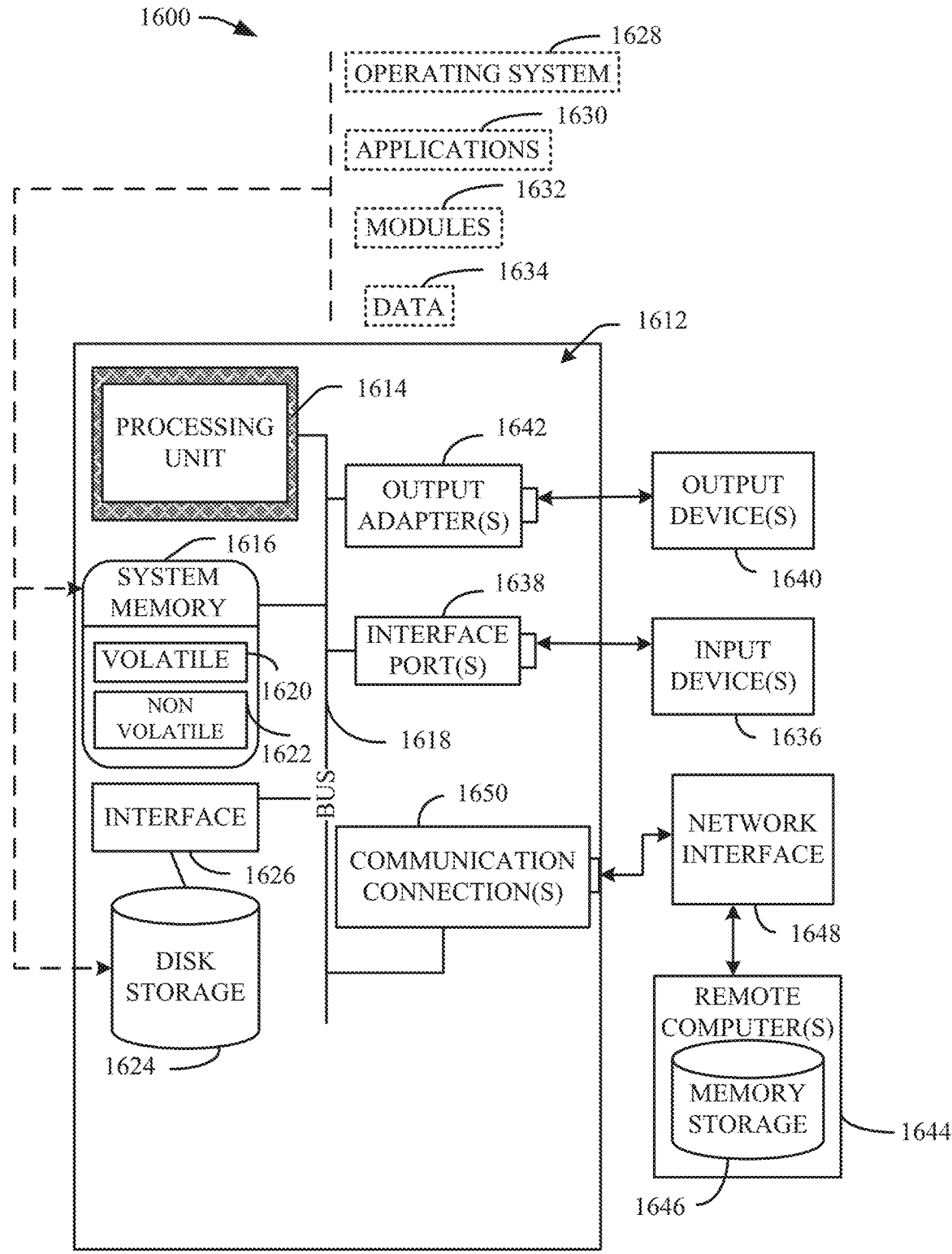
FIG. 16 illustrates a block diagram of an example, non-limiting operating environment in which one or more embodiments described herein can be facilitated.

In order to provide a context for the various aspects of the disclosed subject matter, FIG. 16 as well as the following discussion are intended to provide a general description of a suitable environment in which the various aspects of the disclosed subject matter can be implemented. FIG. 16 illustrates a block diagram of an example, non-limiting operating environment in which one or more embodiments described herein can be facilitated.

With reference to FIG. 16, a suitable operating environment 1600 for implementing various aspects of this disclosure can also include a computer 1612. The computer 1612 can also include a processing unit 1614, a system memory 1616, and a system bus 1618. The system bus 1618 couples system components including, but not limited to, the system memory 1616 to the processing unit 1614. The processing unit 1614 can be any of various available processors. Dual microprocessors and other multiprocessor architectures also can be employed as the processing unit 1614. The system bus 1618 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1616 can also include volatile memory 1620 and nonvolatile memory 1622. The basic input/output system (BIOS), containing the basic routines to transfer information between elements within the computer 1612, such as during start-up, is stored in nonvolatile memory 1622. Computer 1612 can also include removable/non-removable, volatile/non-volatile computer storage media. FIG. 16 illustrates, for example, a disk storage 1624. Disk storage 1624 can also include, but is not limited to, devices like a magnetic disk drive, floppy disk drive, tape drive, Jaz drive, Zip drive, LS-100 drive, flash memory card, or memory stick. The disk storage 1624 also can include storage media separately or in combination with other storage media. To facilitate connection of the disk storage 1624 to the system bus 1618, a removable or non-removable interface is typically used, such as interface 1626. FIG. 16 also depicts software that acts as an intermediary between users and the basic computer resources described in the suitable operating environment 1600. Such software can also include, for example, an operating system 1628. Operating system 1628, which can be stored on disk storage 1624, acts to control and allocate resources of the computer 1612.

System applications 1630 take advantage of the management of resources by operating system 1628 through program modules 1632 and program data 1634, e.g., stored either in system memory 1616 or on disk storage 1624. It is to be appreciated that this disclosure can be implemented with various operating systems or combinations of operating systems. A user enters commands or information into the computer 1612 through input device(s) 1636. Input devices 1636 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1614 through the system bus 1618 via interface port(s) 1638. Interface port(s) 1638 include, for example, a serial port, a parallel port, a game port, and a universal serial bus (USB). Output device(s) 1640 use some of the same type of ports as input device(s) 1636. Thus, for example, a USB port can be used to provide input to computer 1612, and to output information from computer 1612 to an output device 1640. Output adapter 1642 is provided to illustrate that there are some output devices 1640 like monitors, speakers, and printers, among other output devices 1640, which require special adapters. The output adapters 1642 include, by way of illustration and not limitation, video and sound cards that provide a means of connection between the output device 1640 and the system bus 1618. It should be noted that other devices and/or systems of devices provide both input and output capabilities such as remote computer(s) 1644.

Computer 1612 can operate in a networked environment using logical connections to one or more remote computers, such as remote computer(s) 1644. The remote computer(s) 1644 can be a computer, a server, a router, a network PC, a workstation, a microprocessor based appliance, a peer device or other common network node and the like, and typically can also include many or all of the elements described relative to computer 1612. For purposes of brevity, only a memory storage device 1646 is illustrated with remote computer(s) 1644. Remote computer(s) 1644 is logically connected to computer 1612 through a network interface 1648 and then physically connected via communication connection 1650. Network interface 1648 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1650 refers to the hardware/software employed to connect the network interface 1648 to the system bus 1618. While communication connection 1650 is shown for illustrative clarity inside computer 1612, it can also be external to computer 1612. The hardware/software for connection to the network interface 1648 can also include, for exemplary purposes only, internal and external technologies such as, modems including regular telephone grade modems, cable modems and DSL modems, ISDN adapters, and Ethernet cards.

The present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising,
    a memory that stores computer executable components;
    a processor, operably coupled to the memory, and that executes the computer executable components stored in the memory, wherein the computer executable components comprise:
        a partitioning component that partitions an input quantum circuit comprising a machine-readable specification of a quantum circuit into sub-circuits based on at least two groups of qubits identified for tensor slicing, wherein the sub-circuits have associated sets of qubits to be used for tensor slicing;
        a simulating component that simulates the input quantum circuit in stages based on the sub-circuits into a simulated quantum state tensor, one stage per sub-circuit, wherein a set of qubits associated with a sub-circuit is used to partition the simulated quantum state tensor for the input quantum circuit into quantum state tensor slices and quantum gates in that sub-circuit are used to update the quantum state tensor slices into updated quantum state tensor slices; and
        a read-write component that stores the updated quantum state tensor slices of the simulated quantum state tensor to secondary storage as micro slices.

2. The system of claim 1, wherein the read-write component writes the micro slices with a size that spans at least two disk sectors of the secondary storage.

3. The system of claim 1, wherein the read-write component retrieves the updated quantum state tensor slices from the secondary storage, and wherein the simulating component processes another sub-circuit into other sub-circuit tensors and updates the other sub-circuit tensors with the updated quantum state tensor slices retrieved from the secondary storage into further updated quantum state tensor slices.

4. The system of claim 1, wherein the read-write component stores the further updated quantum state tensor slices in the secondary storage.

5. The system of claim 1, wherein the partitioning component partitions the input quantum circuit into qubit partitioning groups corresponding to the sub-circuits, including a first qubit partitioning group, a second qubit partitioning group, a third qubit partitioning group and a fourth qubit partitioning group, wherein the simulating component applies quantum gates of the third qubit partitioning group to the tensor slices of the first qubit partitioning group and second qubit partitioning group to obtain the updated quantum state tensor, wherein the read-write component reads the updated quantum state tensor slices from the secondary storage into memory, and wherein the simulating component applies quantum gates of the fourth qubit partitioning group to the updated quantum state tensor slices to obtain a further updated quantum state tensor.

6. The system of claim 5, wherein the input quantum circuit comprises at least forty-nine qubits and has a circuit depth level of at least fifty.

7. A computer-implemented method, comprising,
    processing, by a device operatively coupled to a processor, an input quantum circuit comprising a machine-readable specification of a quantum circuit, the processing comprising,
    partitioning, by the device, the input quantum circuit into groups of sub-circuits based on at least two groups of qubits identified for tensor slicing, wherein the groups of sub-circuits have associated sets of qubits to be used for tensor slicing;
    simulating, by the device, the input quantum circuit in stages based on the groups of sub-circuits into a simulated quantum state tensor, one stage per sub-circuit, wherein a set of qubits associated with a sub-circuit is used to partition the simulated quantum state tensor for the input quantum circuit into quantum state tensor slices and quantum gates in the sub-circuit are used to update the quantum state tensor slices into updated quantum state tensor slices; and
    storing, by the device, the updated quantum state tensor slices of the simulated quantum state tensor to secondary storage as micro slices.

8. The computer-implemented method of claim 7, wherein the storing the updated quantum state tensor slices of the simulated quantum state tensor to secondary storage as micro slices comprises storing the micro slices in at least two disk sectors of the secondary storage.

9. The computer-implemented method of claim 7, further comprising: processing, by the device, another sub-circuit into other sub-circuit tensors, retrieving the updated quantum state tensor slices from the secondary storage, and updating the other sub-circuit tensors with the updated quantum state tensor slices retrieved from secondary storage into further updated quantum state tensor slices.

10. The computer-implemented method of claim 9, further comprising: storing, by the device, the further updated quantum state tensor slices in the secondary storage.

11. The computer-implemented method of claim 7, wherein the partitioning the input quantum circuit into the groups of sub-circuits comprises partitioning the input quantum circuit into a first sub-circuit partitioning group, a second sub-circuit partitioning group and a third sub-circuit partitioning group, and wherein the storing the updated quantum state tensor slices comprises applying gates of the third sub-circuit partitioning group to tensor slices corresponding to the first sub-circuit partitioning group and the second sub-circuit partitioning group to obtain the updated quantum state tensor slices.

12. The computer-implemented method of claim 11, wherein the partitioning the input quantum circuit into the groups of sub-circuits further comprises partitioning the input quantum circuit into a fourth sub-circuit partitioning group, and further comprising, retrieving the updated quantum state tensor slices from the secondary storage, and updating other sub-circuit tensors with the updated quantum state tensor slices retrieved from the secondary storage into further updated quantum state tensor slices, comprising applying gates of the fourth sub-circuit partitioning group.

13. A computer program product for simulating quantum circuits including an input quantum circuit comprising a machine-readable specification of a quantum circuit, the computer program product comprising one or more computer readable storage media having program instructions embodied therewith, the program instructions executable by a processing component to cause the processor to:
partition the input quantum circuit into groups of sub-circuits based on at least two groups of qubits identified for tensor slicing, wherein the groups of sub-circuits have associated sets of qubits to be used for tensor slicing;
simulate the input quantum circuit in stages based on the groups of sub-circuits into a simulated quantum state tensor, one stage per sub-circuit, wherein a set of qubits associated with a sub-circuit is used to partition the simulated quantum state tensor for the input quantum circuit into quantum state tensor slices and quantum gates in the sub-circuit are used to update the quantum state tensor slices into updated quantum state tensor slices; and
store the updated quantum state tensor slices of the simulated quantum state tensor to secondary storage as micro slices.

14. The computer program product of claim 13, wherein the storing the updated quantum state tensor slices of the simulated quantum state tensor to secondary storage as micro slices comprises storing the micro slices in at least two disk sectors of the secondary storage.

15. The computer program product of claim 13, further comprising processing another sub-circuit into other sub-circuit tensors, retrieving the updated quantum state tensor slices from the secondary storage, and updating the other sub-circuit tensors with the updated quantum state tensor slices retrieved from secondary storage into further updated quantum state tensor slices.

16. The computer program product of claim 13, wherein the partitioning the input quantum circuit into the groups of sub-circuits comprises partitioning the input quantum circuit into a first sub-circuit partitioning group, a second sub-circuit partitioning group and a third sub-circuit partitioning group, and wherein the storing the updated quantum state tensor slices comprises applying gates of the third sub-circuit partitioning group to tensor slices corresponding to the first sub-circuit partitioning group and the second sub-circuit partitioning group to obtain the updated quantum state tensor slices.

17. The computer program product of claim 13, wherein the partitioning the input quantum circuit into the groups of sub-circuits further comprises instructions for partitioning the input quantum circuit into a fourth sub-circuit partitioning group, and further comprising, retrieving the updated quantum state tensor slices from the secondary storage, and updating other sub-circuit tensors with the updated quantum state tensor slices retrieved from the secondary storage into further updated quantum state tensor slices, comprising applying gates of the fourth sub-circuit partitioning group.

18. The computer program product of claim 13, having further instructions comprising, processing another sub-circuit into other sub-circuit tensors, retrieving the updated quantum state tensor slices from secondary storage, and updating the other sub-circuit tensors with the updated quantum state tensor slices retrieved from secondary storage into further updated quantum state tensor slices.

19. A computer-implemented method, comprising:
simulating, by a device operatively coupled to a processor, an input quantum circuit comprising a machine-readable specification of a quantum circuit, the simulating comprising:
partitioning, by the device, the input quantum circuit into meta sub-circuits based on at least two groups of qubits identified for tensor slicing, wherein at least one of the meta sub-circuits exceeds a memory of a single processor;
sub-partitioning, by the device, a meta sub-circuit into a sub-sub-circuit that fits within the memory of a single processor;
computing, by the device, tensors for the sub-sub-circuit; and
contracting, by the device, the tensors into tensor slices by tensor slicing.

20. The computer-implemented method of claim 19, further comprising: applying, by the device, gates of another sub-circuit to the tensor slices to obtain updated tensor slices representing quantum state data, and storing the updated tensor slices in a secondary storage.

21. The computer-implemented method of claim 20, further comprising:
retrieving, by the device, the updated tensor slices from secondary storage, applying gates of a further, other sub-circuit to the updated tensor slices to obtain further updated tensor slices.

22. The computer-implemented method of claim 19, wherein a secondary storage comprises one or more disk devices, and further comprising, organizing a met slice into micro slices, wherein a size of the micro slice spans at least two disk sectors of the secondary storage, and wherein the storing the updated tensor slices in the secondary storage comprises storing the micro slices.

23. A computer program product for simulating quantum circuits including an input quantum circuit comprising a machine-readable specification of a quantum circuit, the computer program product comprising one or more computer readable storage media having program instructions embodied therewith, the program instructions executable by a processing component to cause the processor to:
partition the input quantum circuit into meta sub-circuits based on at least two groups of qubits identified for tensor slicing, wherein at least one of the meta sub-circuits exceeds a memory of a single processor;
sub-partition a meta sub-circuit into a sub-sub-circuit that fits within a memory of a single processor;
compute tensors for the sub-sub-circuit; and
contract the tensors into tensor slices by tensor slicing.

24. The computer program product of claim 23, having further instructions comprising, applying gates of another sub-circuit to the tensor slices to obtain updated tensor slices representing quantum state data, and storing the updated tensor slices in a secondary storage.

25. The computer program product of claim 24, wherein the secondary storage comprises one or more disk devices, and further comprising, organizing the quantum state data into micro slices, wherein a size of the micro slice spans at least two disk sectors of the secondary storage, and wherein storing the updated tensor slices in the secondary storage comprise storing the micro slices.

* * * * *